(12) United States Patent
Okumura

(10) Patent No.: US 7,629,913 B2
(45) Date of Patent: Dec. 8, 2009

(54) DATA PROCESSING METHOD, DATA PROCESSING APPARATUS, SOLID-STATE IMAGE PICKUP APPARATUS, IMAGE PICKUP APPARATUS AND ELECTRONIC APPARATUS

(75) Inventor: Kenichi Okumura, Kanagawa (JP)

(73) Assignee: Sony Corporation, Tokyo (JP)

( * ) Notice: Subject to any disclaimer, the term of this patent is extended or adjusted under 35 U.S.C. 154(b) by 30 days.

(21) Appl. No.: 12/148,766

(22) Filed: Apr. 22, 2008

(65) Prior Publication Data

US 2008/0278363 A1 Nov. 13, 2008

(30) Foreign Application Priority Data

May 11, 2007 (JP) ............................ P2007-127097

(51) Int. Cl.
*H03M 1/12* (2006.01)
(52) U.S. Cl. ...................... 341/155; 341/120; 341/156
(58) Field of Classification Search ................ 341/120, 341/155, 118, 156, 157, 159
See application file for complete search history.

(56) References Cited

U.S. PATENT DOCUMENTS

| | | | | |
|---|---|---|---|---|
| 4,775,852 A | * | 10/1988 | Sloane ........................ | 341/118 |
| 5,187,725 A | * | 2/1993 | Eguchi et al. .................. | 377/56 |
| 5,727,036 A | * | 3/1998 | Maertens ...................... | 375/369 |
| 5,841,389 A | * | 11/1998 | Kinugasa et al. ............. | 341/159 |
| 5,963,154 A | * | 10/1999 | Wise et al. ...................... | 341/67 |
| 6,999,132 B1 | * | 2/2006 | Adams et al. ................ | 348/731 |
| 2008/0042888 A1 | * | 2/2008 | Danesh ......................... | 341/157 |

FOREIGN PATENT DOCUMENTS

| JP | 10-028047 | 1/1998 |
|---|---|---|
| JP | 11-168383 | 6/1999 |
| JP | 3141832 | 12/2000 |
| JP | 2002-232291 | 8/2002 |
| JP | 3338294 | 8/2002 |
| JP | 3507800 | 3/2004 |

* cited by examiner

*Primary Examiner*—Peguy JeanPierre
(74) *Attorney, Agent, or Firm*—Robert J. Depke; Rockey, Depke & Lyons, LLC

(57) ABSTRACT

Disclosed herein is a data processing method wherein an analog processing object signal is compared with a reference signal and used to convert the processing object signal into digital data and a counting process is carried out and then a count value at a point of time at which the counting process is completed is retailed to acquire digital data of N bits of the processing object signal, including the steps of: carrying out counting operations using the first and second count clocks, whose frequencies are different by an amount corresponding to a weight of the bits from each other, independently of each other; and compensating for an excess or deficiency of data of the higher order N-M bits counted using the second count clock with respect to the count value counted using the first count clock within the counting operation enabled period.

10 Claims, 21 Drawing Sheets

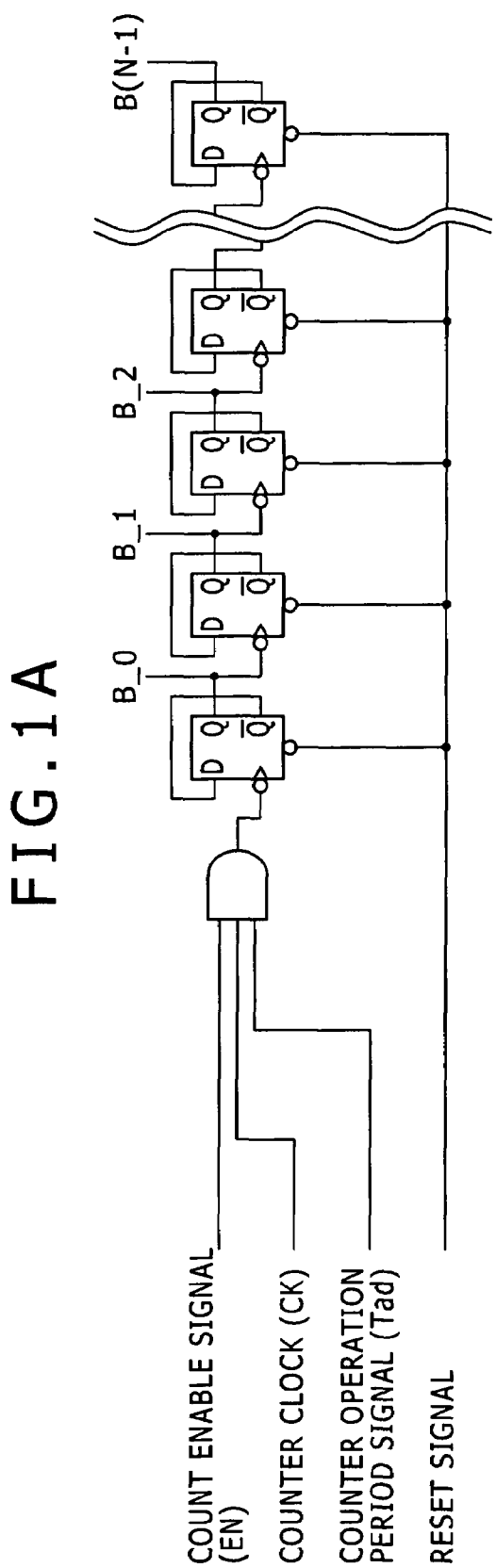

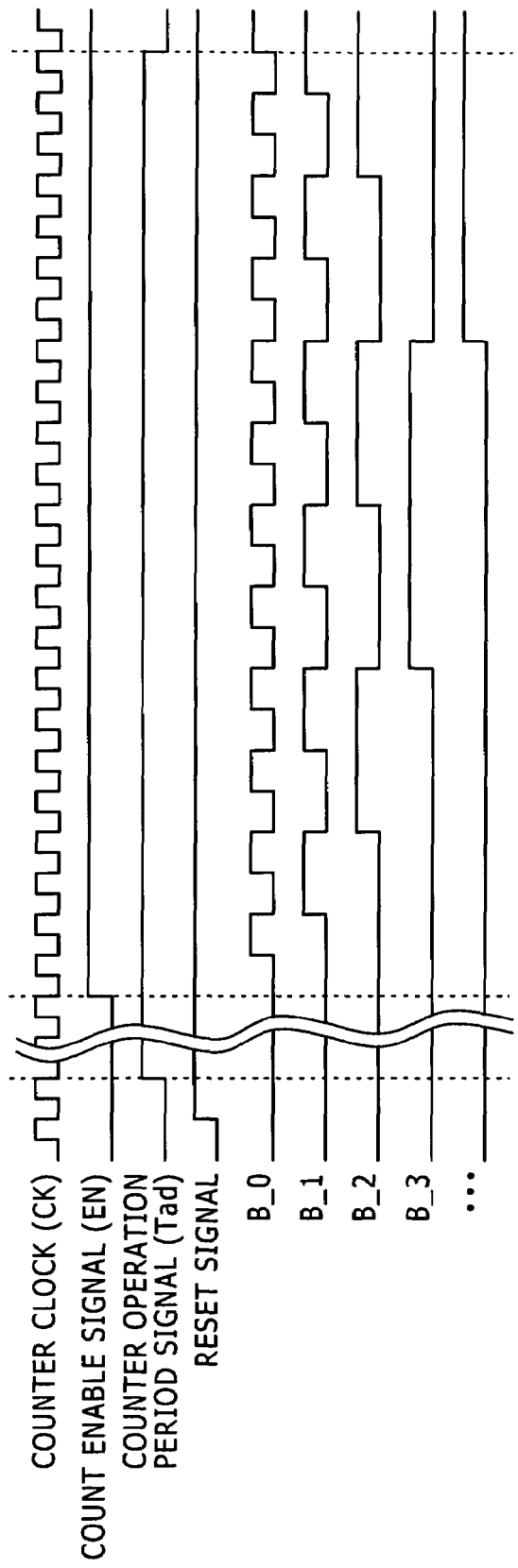

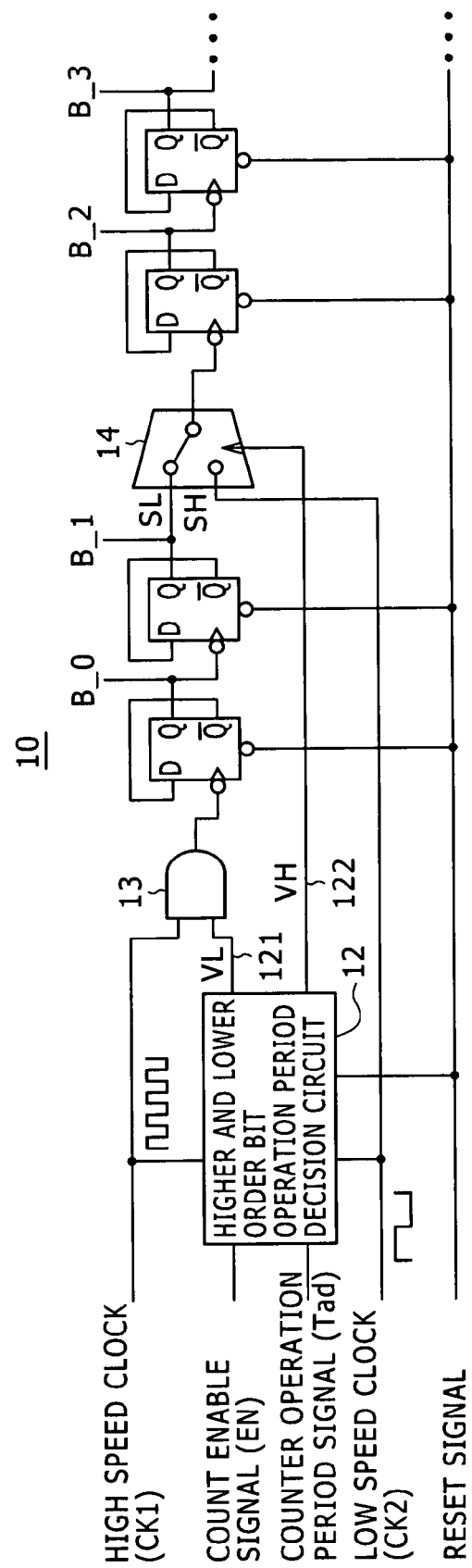

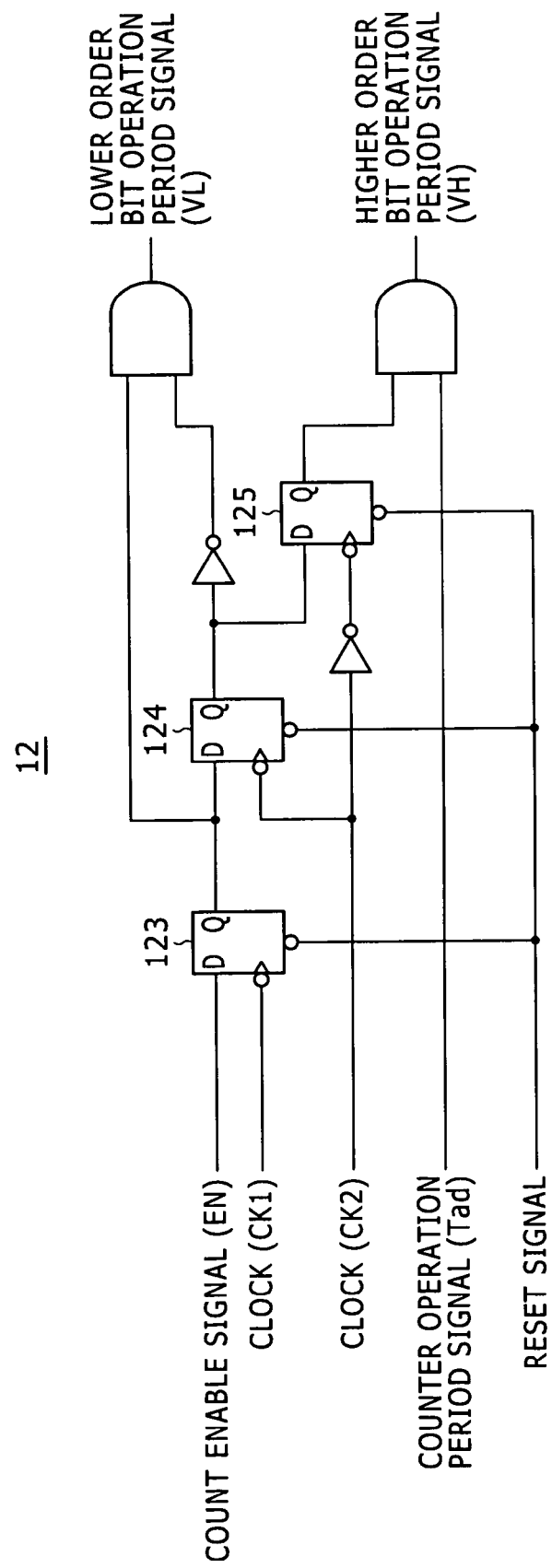

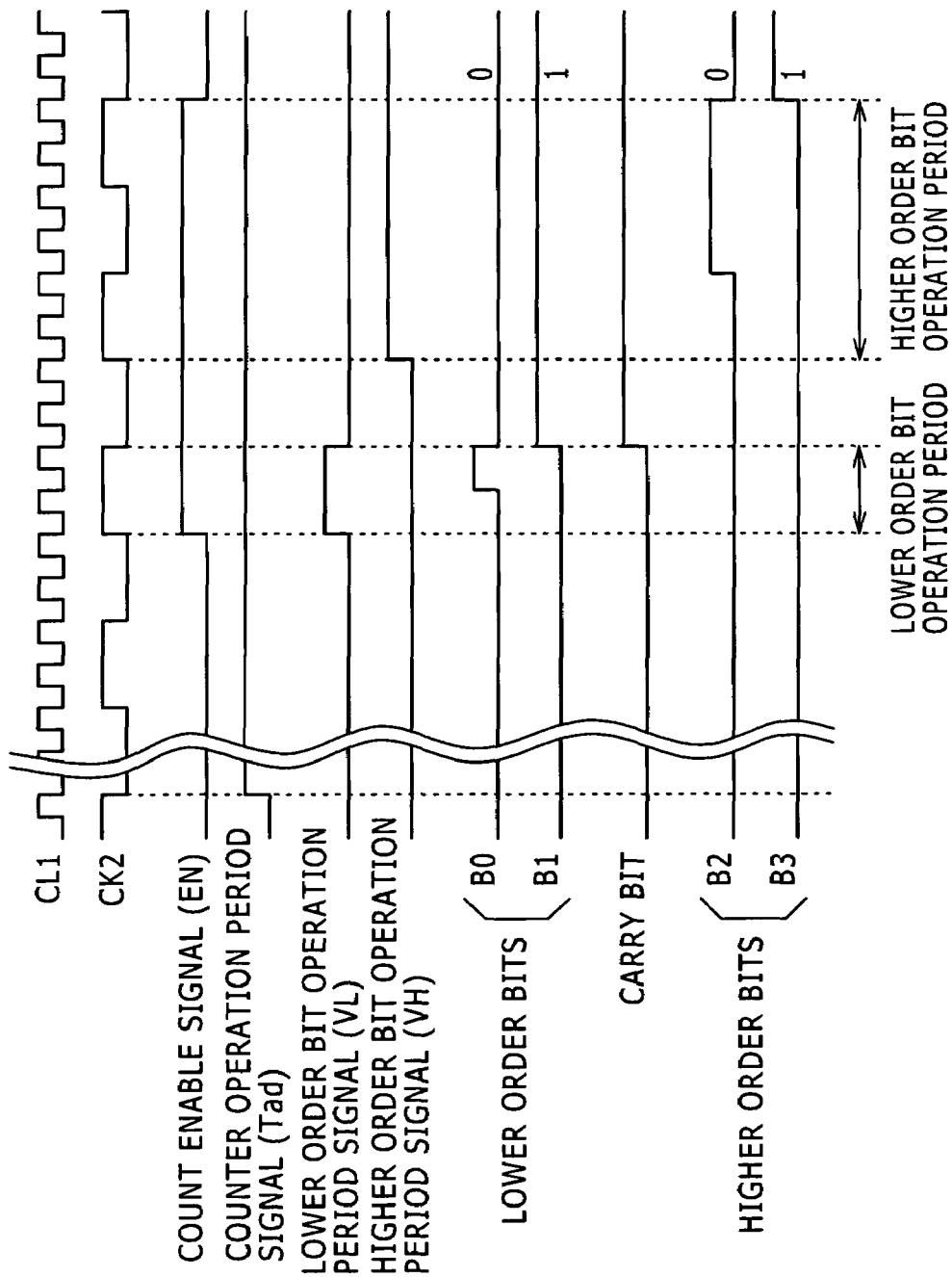

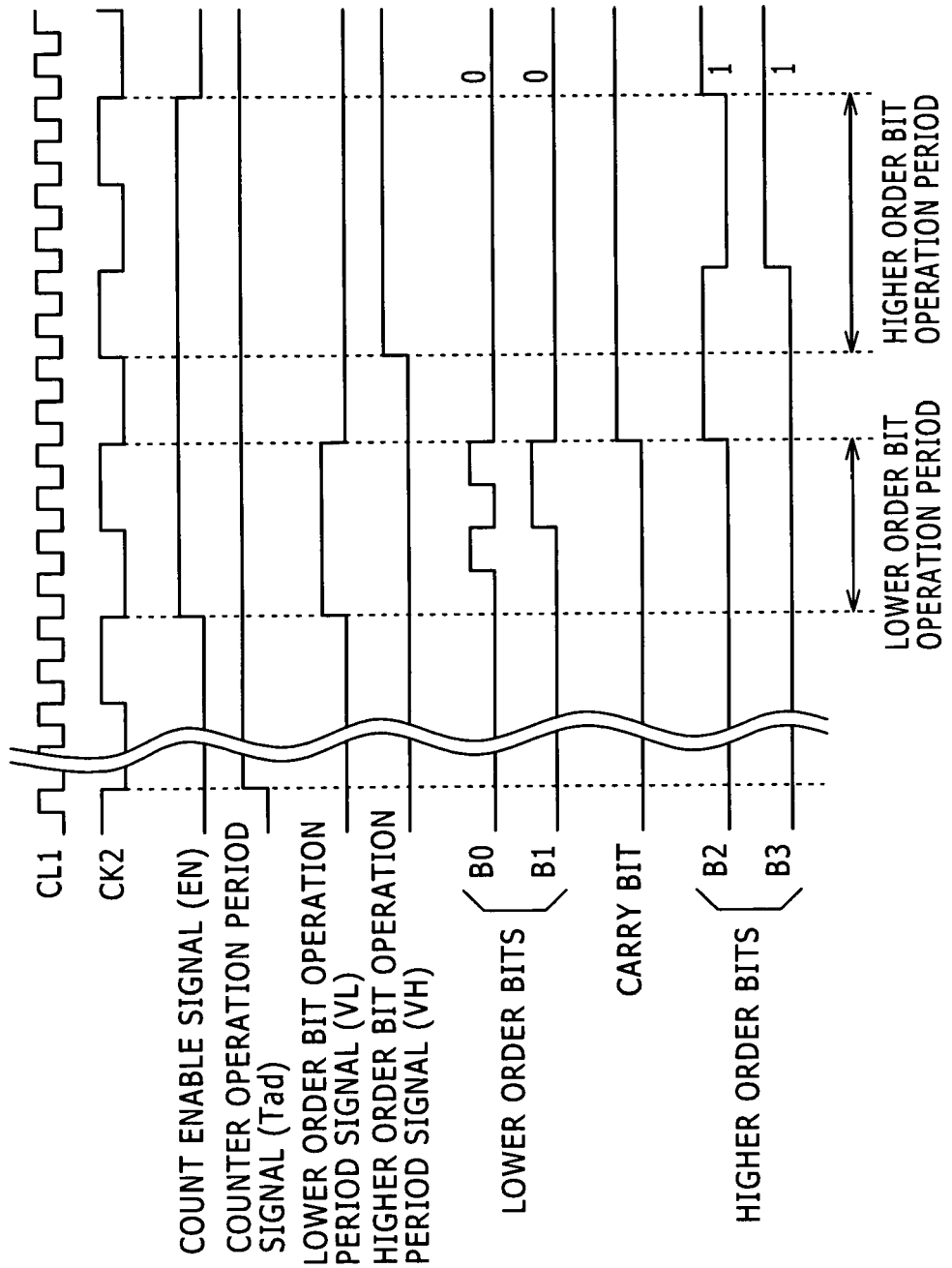

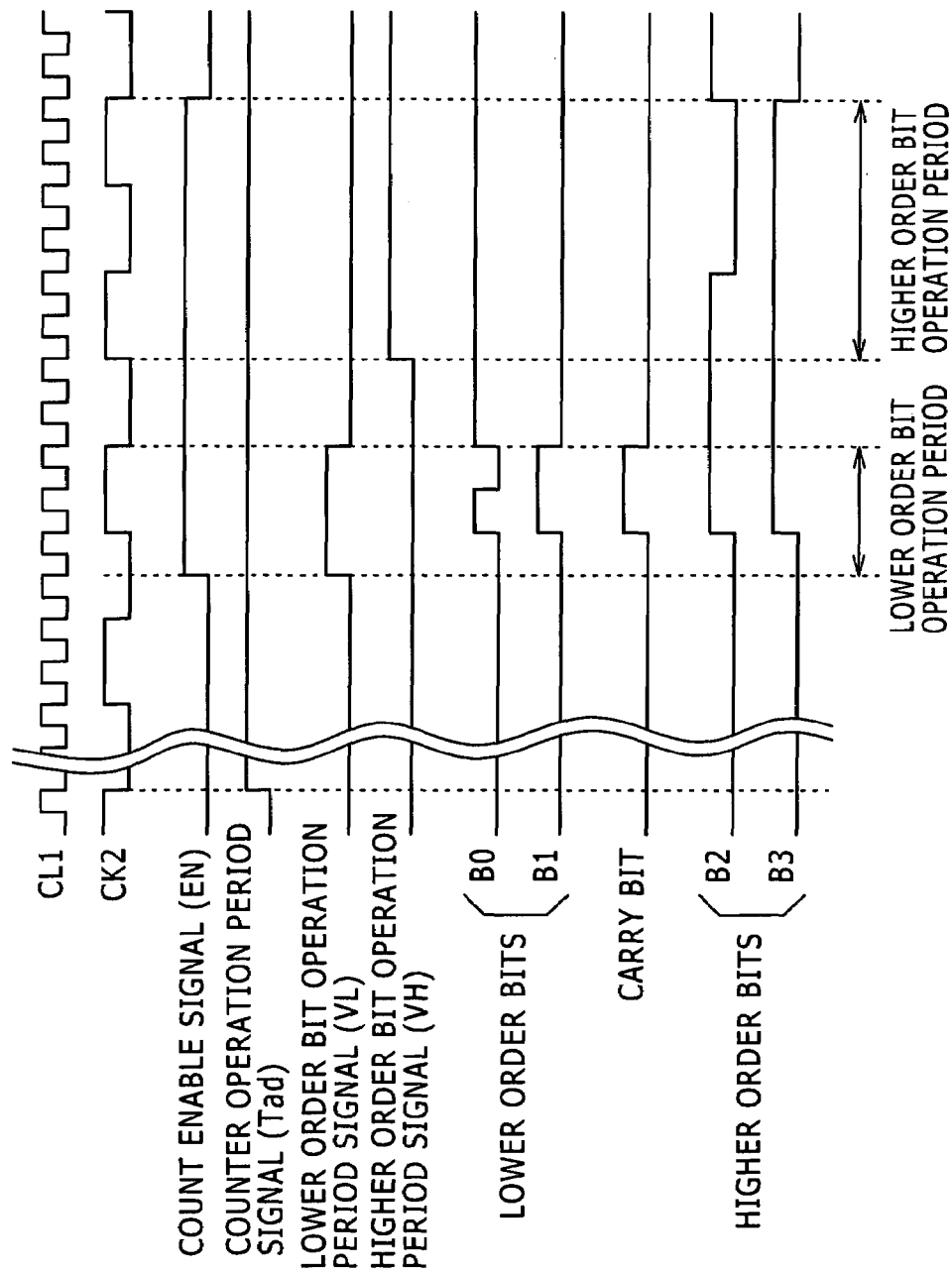

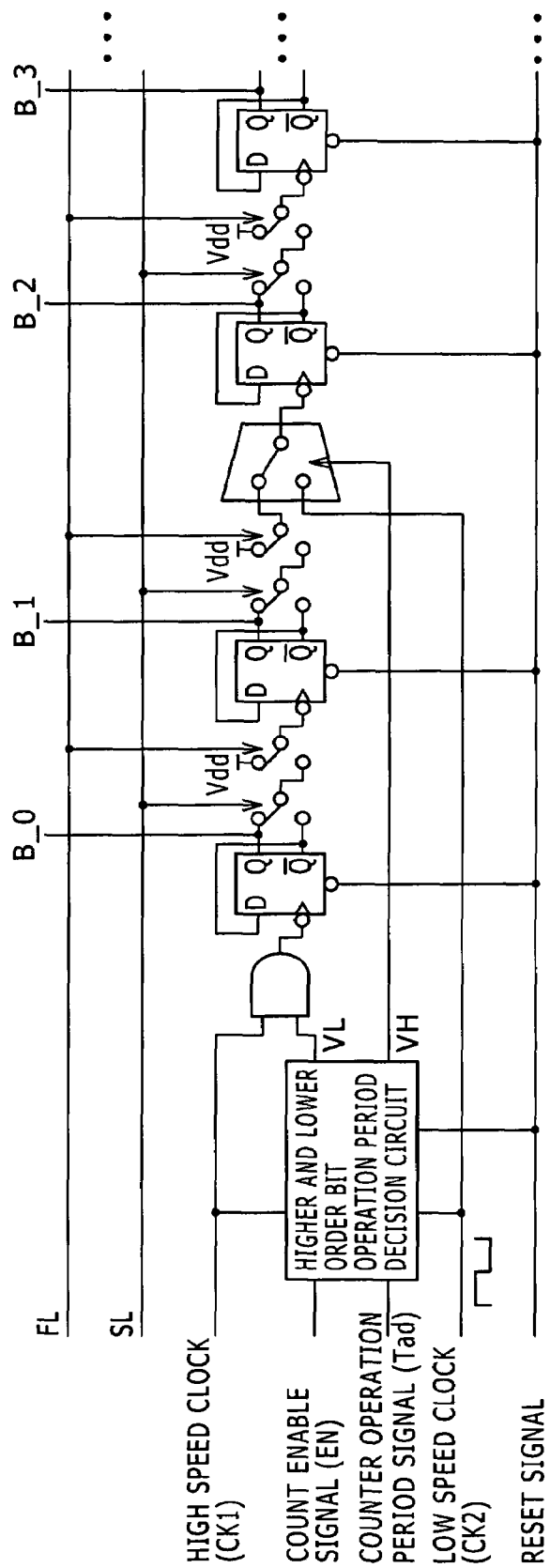

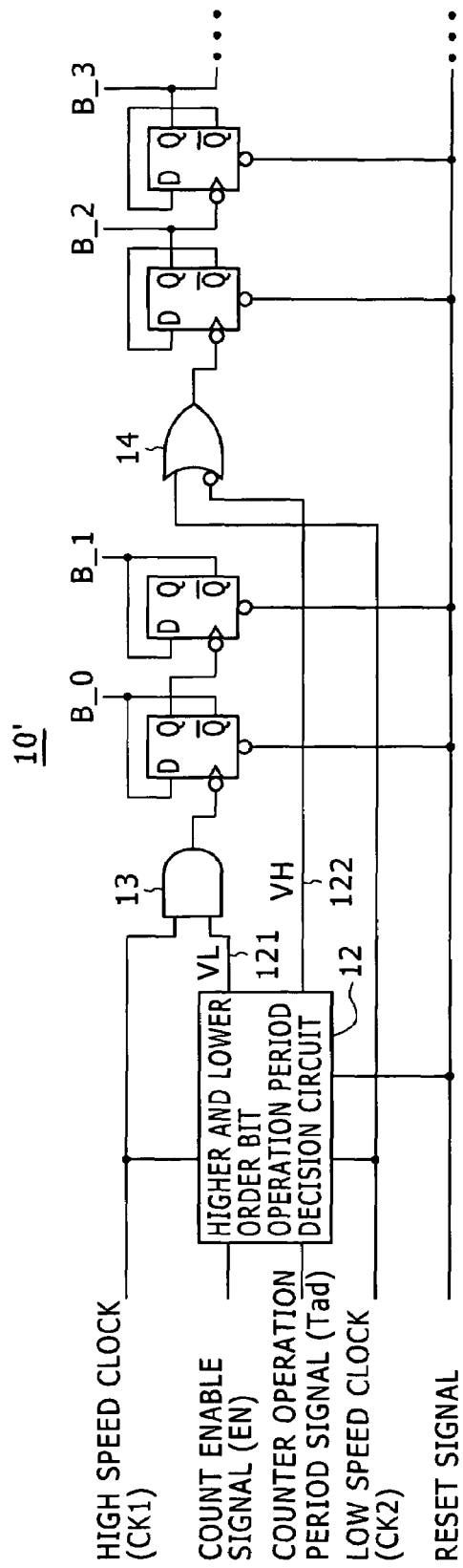

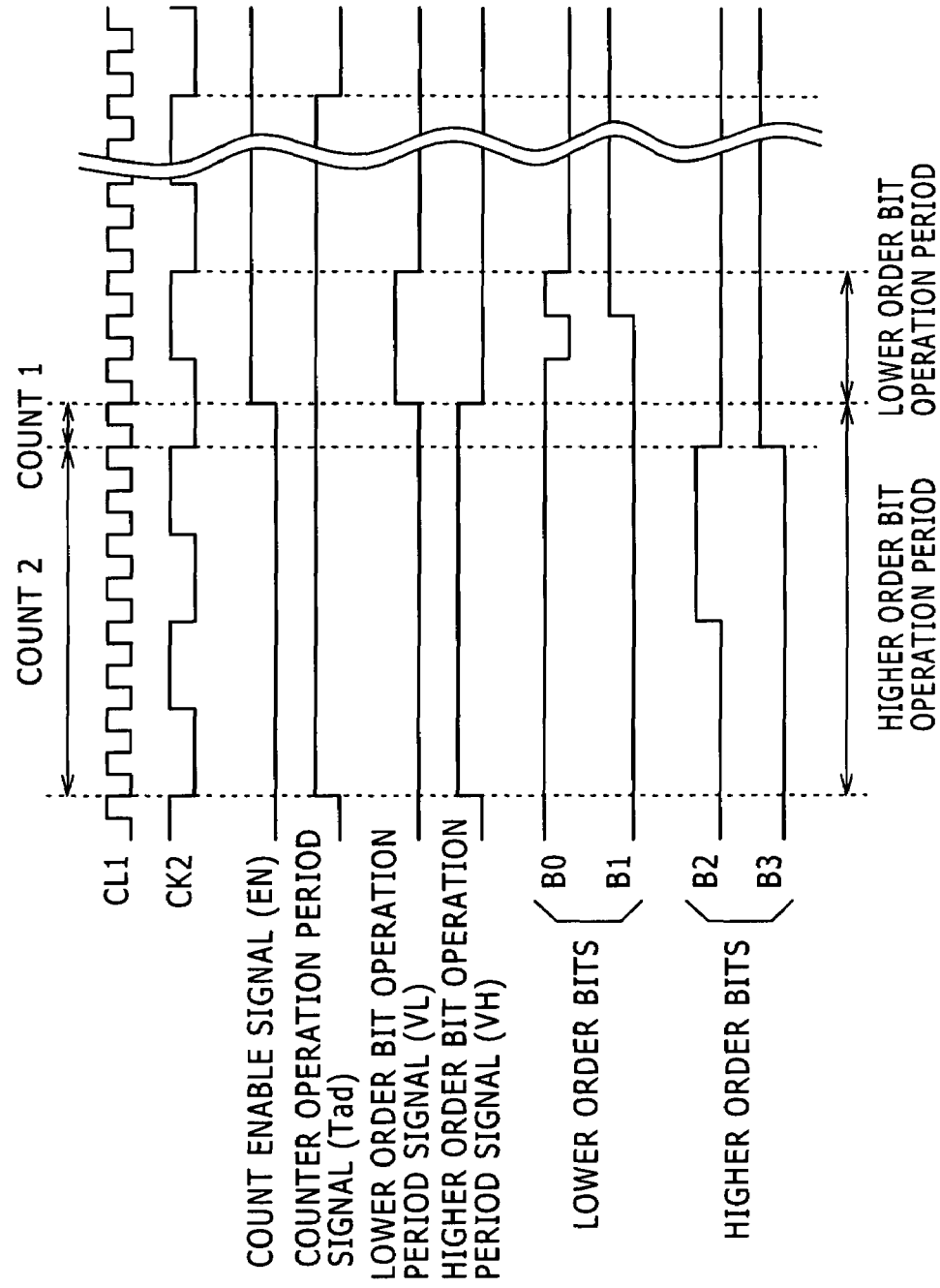

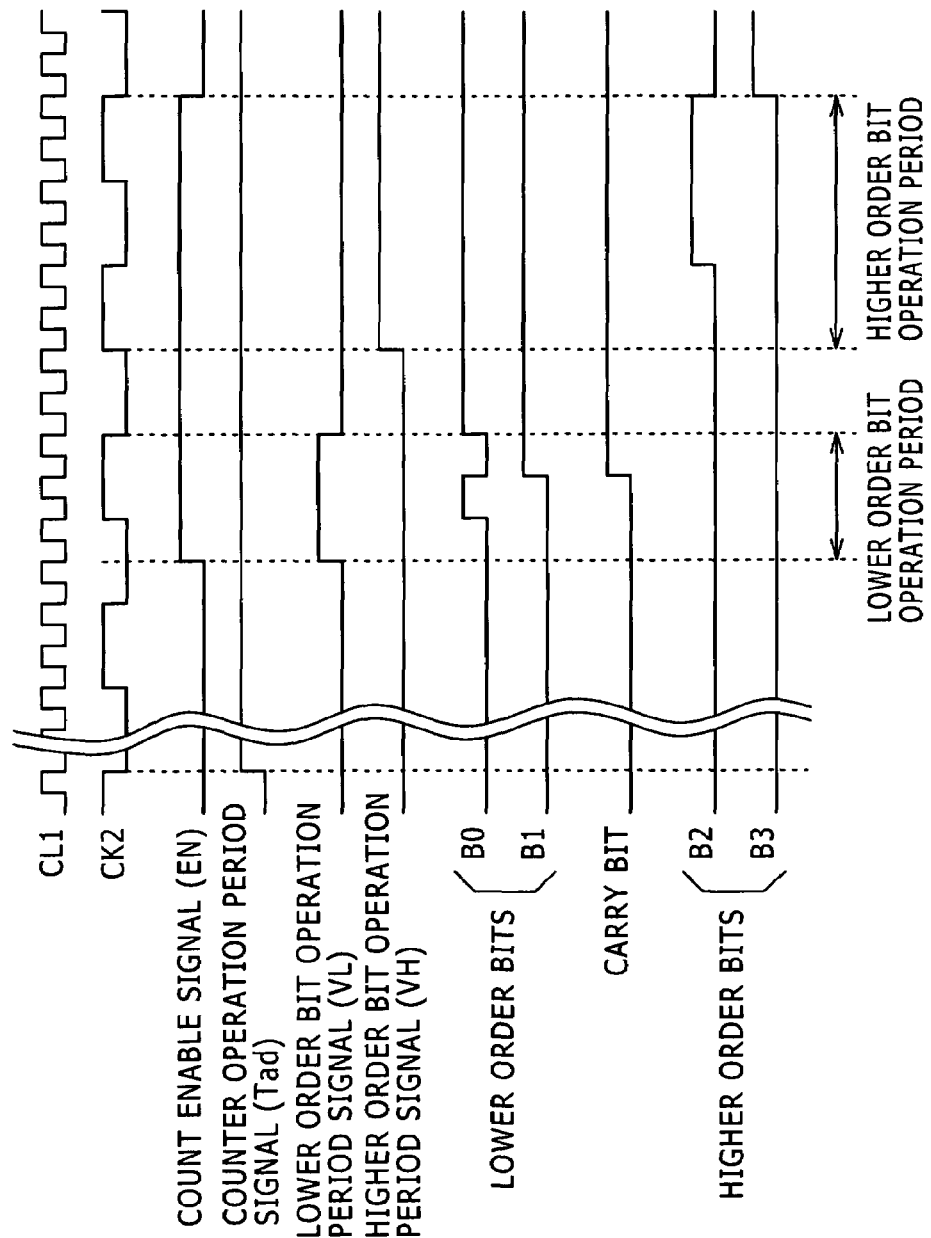

DATA PROCESSING METHOD, DATA PROCESSING APPARATUS, SOLID-STATE IMAGE PICKUP APPARATUS, IMAGE PICKUP APPARATUS AND ELECTRONIC APPARATUS

CROSS REFERENCES TO RELATED APPLICATIONS

The present invention contains subject matter related to Japanese Patent Application JP 2007-127097 filed in the Japan Patent Office on May 11, 2007, the entire contents of which being incorporated herein by reference.

BACKGROUND OF THE INVENTION

1. Field of the Invention

This invention relates to a data processing method and a data processing apparatus wherein AD (analog-digital) conversion is carried out and a solid-state image pickup apparatus, an image pickup apparatus and an electronic apparatus which are semiconductor apparatus for physical quantity distribution detection for which a mechanism for such AD conversion is utilized. More particularly, the present invention relates to a digital signal processing technique suitable for use with a semiconductor apparatus and other electronic apparatus for physical quantity distribution detection such as a solid-state image display apparatus wherein a plurality of unit components having sensitivity to electromagnetic waves inputted from the outside such as light or radiation are arrayed and a physical quantity distribution converted into an electric signal by the unit components can be read out as an electric signal through arbitrary selection by address control. More specifically, the present invention relates to a technique for acquiring digital data when a processing object signal is handled.

2. Description of the Related Art

In recent years, attention is paid to an image sensor of the MOS (Metal Oxide Semiconductor) type or the CMOS (Complementary Metal Oxide Semiconductor) type which can overcome various problems which a CCD (Charge Coupled Device) image sensor as a solid-state image pickup apparatus has.

For example, a CMOS image sensor includes an amplification circuit formed from a floating diffusion amplifier or the like for each pixel. Upon reading out of a pixel signal, as an example of address control, a method called column-parallel output type method or column type method is used frequently. In the method described, a certain row of pixels in a pixel array section is selected, and the pixels of the row are accessed simultaneously so that pixel signals are read out simultaneously and parallelly from the pixel array section with regard to all pixels of the row in a unit of a row.

Further, a solid-state image pickup apparatus sometimes uses a method wherein an analog pixel signal read out from a pixel array section is outputted after converted into digital data by an analog-digital conversion apparatus (AD conversion apparatus; Analog Digital Converter).

This similarly applies to an image sensor of the column-parallel output type, and various signal output circuits have been proposed. As one of the most advanced forms, a method has been proposed wherein an AD converter is provided for each column such that an image signal is extracted as digital data to the outside.

Meanwhile, various AD conversion methods have been proposed from the point of view of the circuit scale, processing speed (increase in speed), resolution and so forth. As an example, an AD conversion method called slope integration type or ramp signal comparison type (hereinafter referred to as reference signal comparison type) is available wherein an analog unit signal is compared with a ramp-shaped reference signal, that is, a ramp wave whose value varies gradually for converting an analog unit signal into digital data, and a counting process is carried out in parallel to the comparison process. Then, the digital data of the unit signal are acquired based on a count value at a point of time at which the comparison process ends. By combining the reference signal comparison type AD conversion method and the above described column parallel output type method, analog outputs of pixels can be AD converted column-parallelly in a low frequency band. Therefore, the combination is considered suitable for an image sensor which achieves both of high picture quality and a high speed.

Here, a pixel signal, particularly the difference between a pixel signal level of a pixel in a reset state and a pixel signal level when signal charge is read out, becomes a true signal component. Also where the reference signal comparison type AD conversion method and the column-parallel output type method are combined such that a pixel signal is converted into digital data simultaneously for all pixels of one row, a mechanism configured taking it into consideration that the differencing process is demanded is adopted. For example, a mechanism is sometimes adopted which carries out changeover of the counting mode between an up counting mode and a down counting is provided and changes over the counting mode depending upon AD conversion of the pixel signal level upon pixel resetting or upon AD conversion of the pixel signal level when signal charge is read out such that an AD conversion result of a true signal component is automatically acquired as a final AD conversion output value. In short, according to the mechanism described, a differentiating processing function is carries out simultaneously with AD conversion.

As a method of reducing power consumption of a counter circuit or an AD converter, for example, a method of providing a stopping period of counter operation, that is, a suspension period, is known and disclosed in Japanese Patent No. 3,338,294 (hereinafter referred to as Patent Document 1) or Japanese Patent No. 3,141,832 (hereinafter referred to as Patent Document 2). Another method of reducing the number of clocks or lowering the clock frequency is known and disclosed in Japanese Patent No. 3,507,800 (hereinafter referred to as Patent Document 3).

For example, Patent Document 1 discloses a method of reducing the power consumption of a counter circuit. More particularly, Patent Document 1 proposes a mechanism wherein, when a certain counter is operating, a counting operation of another counter is stopped and the number of times of reversing operation of a flip-flop is decreased to lower the power consumption.

Meanwhile, Patent Document 2 discloses a method which reduces the power consumption of an AD conversion apparatus. In particular, while a common counter circuit is used, AD conversion is carried out separately for higher order bits and lower order bits. As a method therefor, reference signals of different gains are compared with each other.

On the other hand, Patent Document 3 discloses a method of lowering the clock frequency for an AD conversion circuit. In particular, a reference signal of a stepped shape is used to carry out conversion operation separately for higher order bits and lower order bits. Reduction of the power consumption can be achieved by lowering the clock frequency.

SUMMARY OF THE INVENTION

However, if the mechanism disclosed in Patent Document 1 is used, then it is necessary to "output a count ending signal." However, it is disclosed to use, as a configuration of the counter circuit, a comparison circuit, a frequency divider, a control circuit, a count enable circuit, an original oscillation clock circuit and a counting end decision circuit and use two signals including the original oscillation clock and another clock obtained by dividing the original oscillation clock. Thus, various modifications are made for a basic counter circuit. As a result, it is considered that a large scale is requisite for the counter circuit.

Meanwhile, with the mechanism disclosed in Patent Document 2, when AD conversion is carried out separately for higher order bits and lower order bits, one counter is used, and since the counter circuit is normally operating, it is considered that the power consumption reduction effect is low. Further, since lower order bits and higher order bits are counted with different reference signals, some correction means is requisite. Accordingly, the circuit becomes complicated, and it is estimated difficult to raise the accuracy in counting.

Further, the mechanism disclosed in Patent Document 3 is an AD conversion circuit of the reference signal comparison type, and higher order bits (N-M bits) and lower order bits (M bits) are AD converted using different reference signal potentials. Since transistors usually have a dispersion in resistance and capacitance arising from fabrication, a dispersion appears also in reference signal voltages generated by different voltage generators. Therefore, one bit from among higher order bits and one bit from among lower order bits obtained by AD conversion with different reference voltages do not become accurately $2^M$ times, and the linearity of AD conversion values is not assured. Therefore, a divider or an integrator for adjusting the gains of higher and lower order bits is requisite. It is considered that, in order to adjust the bit accuracy of lower order bits and higher order bits, some correction means is requisite, and it is estimated that the circuit configuration and driving are complicated.

Therefore, it is demanded to provide a data processing method, a data processing apparatus, a solid-state image pickup apparatus, an image pickup apparatus and an electronic apparatus wherein, where a reference signal comparison type AD conversion method is adopted, a general basic configuration can be formed from a reduced number of modifications thereto.

Also it is demanded to provide a data processing method, a data processing apparatus, a solid-state image pickup apparatus, an image pickup apparatus and an electronic apparatus wherein reduction in power consumption is implemented effectively.

According to an embodiment of the present invention, a data processing apparatus includes a reference signal production section configured to produce a predetermined level of an analog signal and a reference signal which has a gradually varying value and is used to convert the predetermined level of the analog signal into digital data, comparing section configured to compare the pixel signal with the reference signal produced by the reference signal production section and a counter section configured to carry out a counting process within a counting operation enabled period and retain a count value at a point of time at which the counting process is completed to acquire digital data of the predetermined level.

In other words, as a mechanism for AD conversion of the analog signal, an AD conversion method called reference signal conversion type AD conversion method is adopted.

Here, the counter section which counts N-bit data includes a lower order bit counter section for lower order M bits which operates with a first count clock or high speed clock which is a relatively high clock and a higher order bit counter section for higher order N-M bits which operates with a second count clock or low speed clock obtained by dividing the first count clock by $2^M$ and having a speed relatively lower than the first count clock. The counter section carries out counting operations using the two different clocks, whose frequencies are different by an amount corresponding to a weight of the bits from each other. In other words, the counter section carries out counting of lower order M bits and higher order N-M bits using clocks independent of each other and having a difference in frequency equal to $\frac{1}{2}^M$ time.

Further, an excess or deficiency of data of the higher order N-M bits counted using the low speed clock counted by the higher order bit counter section with respect to the count value counted using the high speed clock within the counting operation enabled period is compensated for using the data of the lower order M bits counted using the high speed clock by the low order bit counter section. In particular, a lower order bit operation period within which the period (=H*Th) of the product of the count value H counted using the high speed clock and one period Th of the high speed clock becomes deficient or excessive with respect to the count operation enabled period is counted using the high speed clock by the low order bit counter section.

Then, the count value H counted with the low speed clock by the higher order bit counter section is corrected with the count value L counted using the high speed clock by the low order bit counter section. If deficiency is detected, then correction of adding the count value L to the count value H is carried out, but if excess is detected, then correction of subtracting the count value L from the count value H is carried out.

Since binary data can be outputted from both counter sections, for the compensation for the excess or deficiency, actually it is necessary to connect the count value (binary value) by the lower order bit counter section and the count value (binary value) by the lower order bit counter section to each other taking weighting of the bits into consideration.

In other words, the counting operation periods of the lower order bit counter section and the higher order bit counter section are determined based on the counting operation enabled period such that, when the count value (binary value) by the higher order bit counter section and the count value (binary value) by the lower order bit counter section are connected to each other taking weighting of the bits of the N-bit digital data into consideration, an excess or deficiency of data of the higher order N-M bits counted using the low speed clock with respect to the count value counted using the high speed clock within the counting operation enabled period is compensated for using the data of the lower order M bits counted using the high speed clock.

The data processing apparatus is different from the mechanism disclosed in Patent Document 2 in that the counter section includes or is divided into the lower order bit counter section which acquires data of the lower order M bits and the higher order bit counter section which acquires data of the higher order N-M bits. Due to this difference, the counters can be controlled independently of each other, and new control which makes use of this point can be implemented. For example, the operation periods for higher and lower order bits are decided and controlled within the counting operation enabled period, and preferably, the counter sections for the lower order M bits and the higher order N-M bits are operated selectively.

Since one of the two counter sections selectively operates, the power consumption can be reduced by an amount by which the other one of the counter sections stops. Particularly, since the portion of the counter section which consumes the power most is counting operation of lower order bits, if the counting operation of lower order bits is stopped upon counting operation of higher order bits, then a high reduction effect of the power consumption is achieved.

A solid-state image pickup apparatus, an image pickup apparatus and an electronic apparatus are apparatus to which the data processing method described above is applied and include a configuration similar to that of the data processing apparatus. The solid-state image pickup apparatus may be in the form of an apparatus formed as one chip or may be in the form of a module wherein an image pickup section and a signal processing section or an optical system are collectively packaged and which has an image pickup function. The present invention can be applied to an image pickup apparatus as well as to a solid-state image pickup apparatus. In this instance, similar effects to those achieved by the solid-state image pickup apparatus are achieved by the image pickup apparatus. Here, the image pickup apparatus may be, for example, a camera or a portable apparatus having an image pickup function. Further, the "image pickup" includes, in a broad sense, detection of a fingerprint or the like as well as includes fetching of an image upon ordinary image pickup of a camera.

With the data processing method, data processing apparatus, solid-state image pickup apparatus, image pickup apparatus and electronic apparatus, a novel method wherein lower order M bits and higher order N-M bits are counted using clocks independent of each other and having a difference in frequency of $\frac{1}{2}^{\wedge}M$ time can be implemented.

Although control signals for causing the lower and higher order bit counter sections to carry out counting of lower and higher order bits using clocks independent of each other are requisite, the degree of such modification is lower than that of the mechanism disclosed in Patent Document 1.

By using the method wherein lower order bits and higher order bits are counted using clocks independent of each other, the counter sections can be controlled independently of each other, and the power consumption can be reduced, for example, by stopping the counting operation of one of the counter sections while the counting operation of the other counter section is proceeding.

Further, since an excess or deficiency of higher order bit data counted using the low speed clock with respect to the count value counted using the high speed clock within the counting operation enabled period is compensated for with low order bit data counted using the high speed clock, the bit accuracy of AD conversion is defined not by the low speed clock used by the higher order bit counter section but by the high speed clock used by the low order bit counter section. With the data processing method, data processing apparatus, solid-state image pickup apparatus, image pickup apparatus and electronic apparatus, the accuracy same as that achieved by counting all bits with the high speed clock without applying the embodiment of the present invention can be maintained.

The compensation for the excess or deficiency wherein low order bit data are used can be carried out by connecting the count value (binary value) by the higher order bit count value and the count value (binary value) by the lower order bit counter section taking the weighting of the bits into consideration. Different from the mechanisms of Patent Document 2 and Patent Document 3, no special compensation means is requisite.

BRIEF DESCRIPTION OF THE DRAWINGS

FIG. 1A is a block diagram showing an example of a circuit configuration of an existing asynchronous N-bit counter;

FIG. 1B is a timing chart illustrating operation of the N-bit counter of FIG. 1A;

FIG. 3A is a block diagram of a counter circuit according to a first working example of the present invention which includes an asynchronous counter;

FIG. 3B is a circuit diagram showing a higher and lower order bit operation period decision circuit of the counter circuit of FIG. 3A;

FIGS. 3C and 3D are timing charts illustrating different counting operations of the counter circuit of FIG. 3A;

FIG. 3F is a timing chart illustrating counting operation of the counter circuit of FIG. 3E;

FIG. 3G is a block diagram of a further counter circuit according to the first working example of the present invention which includes a mechanism disclosed in Japanese Patent Laid-Open No. 2005-311933;

FIG. 4A is a block diagram of a counter circuit according to a second working example of the present invention which includes an asynchronous counter;

FIG. 4C is a timing chart illustrating counting operation of the counter circuit of FIG. 4A;

FIG. 5B is a timing chart illustrating counting operation of the counter circuit of FIG. 5A;

DETAILED DESCRIPTION OF THE PREFERRED EMBODIMENT

<General Outline>

Figure 6:
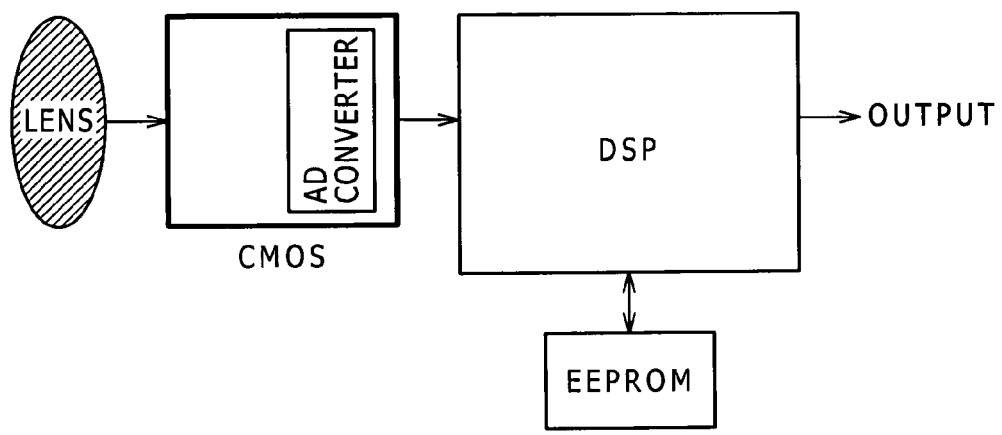
FIG. 6 is a functional block diagram of a popular CMOS sensor.

FIG. 6 is a functional block diagram of a popular CMOS sensor. Referring to FIG. 6, incoming light passes through a lens and is converted into an analog charge signal by a CMOS sensor section. The charge signal is converted into a voltage or current and then A/D converted by the CMOS sensor section, whereafter it is outputted finally as digital data from the CMOS sensor section. The digital data is subjected to various digital data processes by a DSP (Digital Signal Processor) section and is partly stored into a memory section such as an EEPROM (Electrically Erasable Programmable ROM, which is a ROM electrically erasable by program control and is a nonvolatile memory) or the like.

Figure 7:
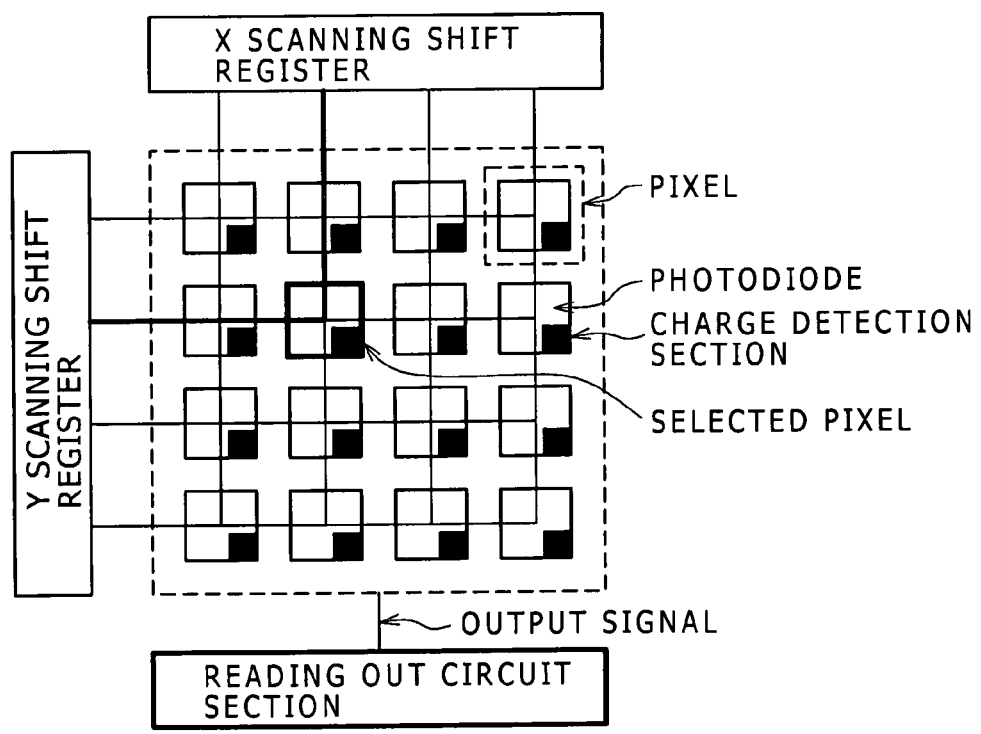
FIG. 7 is a block diagram showing a general configuration of the CMOS sensor shown in FIG. 6.

FIG. 7 is a schematic view of the CMOS sensor section shown in FIG. 6. Referring to FIG. 7, the CMOS sensor section includes an X direction scanning section, a Y direction scanning section, a pixel array section and a reading out circuit section. Each pixel section includes a photoelectric conversion section (photodiode) and a charge detection section. The pixels exhibit a form of a matrix defined by X-Y addresses. A pixel signal defined and selected in accordance with X-Y addresses by the shift registers is outputted through an output transistor built in each pixel. It is a significant characteristic of the CMOS sensor section that the order in which pixel signals are outputted in this instance is not unique as in the case of a CCD sensor section but is free.

Figure 8:
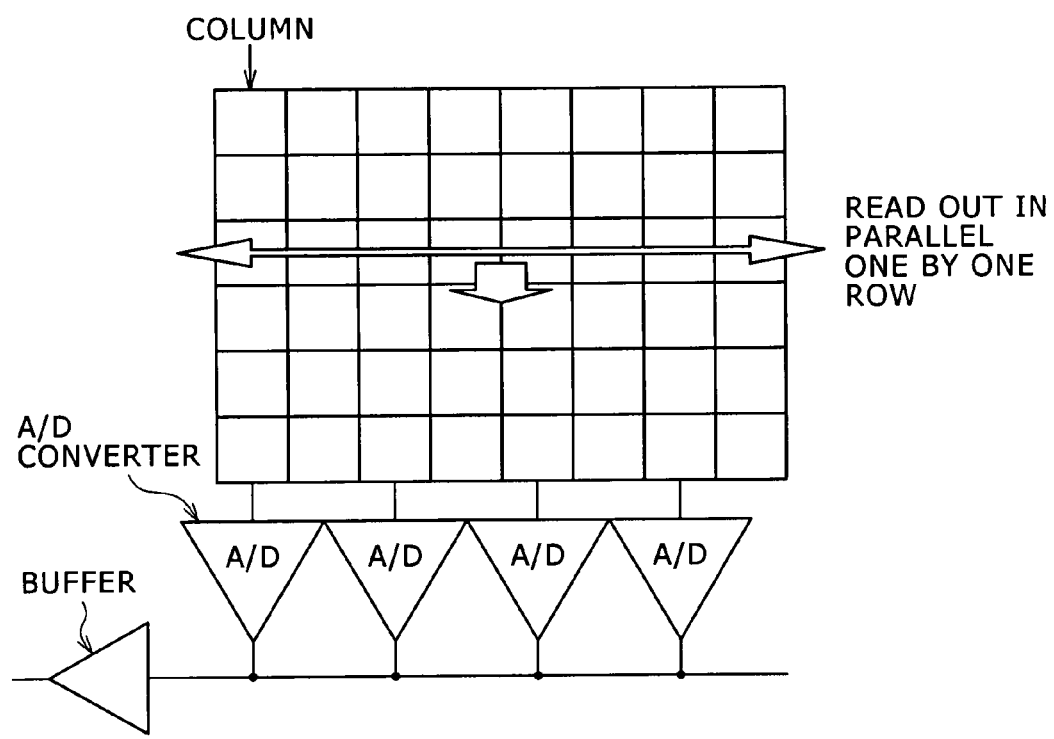
FIG. 8 is a schematic view showing a general configuration of a readout section of the CMOS sensor shown in FIG. 7.

FIG. 8 shows a general configuration of the readout circuit section of the CMOS sensor shown in FIG. 7 where a column ADC reading out method is used. Referring to FIG. 8, in the configuration shown, an A/D converter is provided for each column such that an analog image signal selected by a shift register is converted into digital data through the A/D converter connected to each column.

Figure 9:
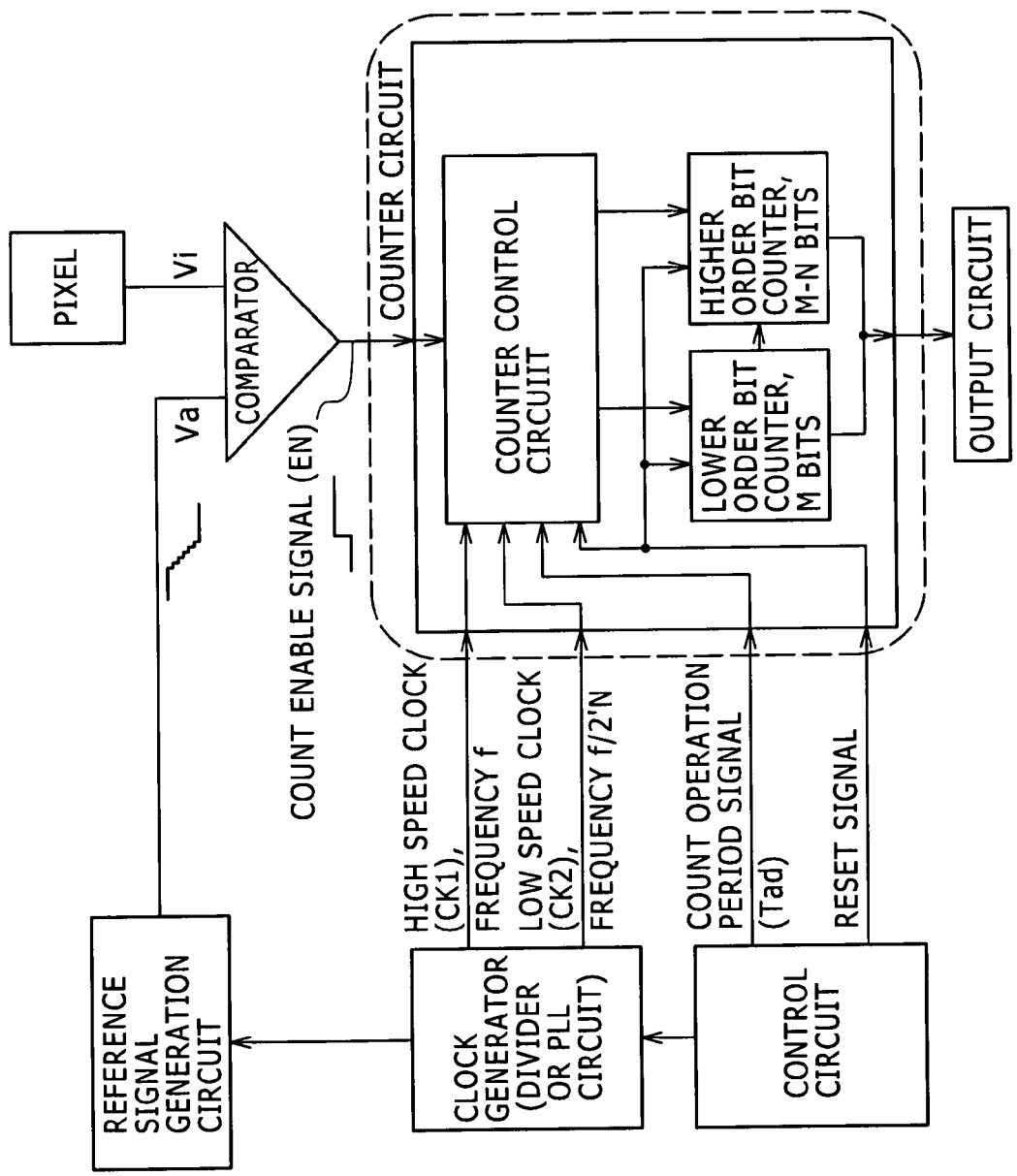
FIG. 9 is a block diagram showing a counter circuit to which the present invention is applied where it is connected to a reference wave comparison type AD converter.

FIG. 9 shows a counter circuit to which the present invention is applied and which is connected to a reference wave comparison type AD converter. Referring to FIG. 9, an analog electric signal Vi obtained by photoelectric conversion by a photodiode in a pixel is inputted from a vertical signal line of the pixel to one of terminals of a comparator. To the other terminal of the comparator, a reference signal voltage Va from a reference signal generator is inputted. The comparator compares the analog electric signal Vi and the reference signal voltage Va with each other and passes an output signal of "1" or "0," which depends upon which one of the analog electric signal Vi and the reference signal voltage Va is higher in level, to the counter circuit. The counter circuit counts a clock signal received from a clock generator within an operation enabled period from a control circuit with reference to the counter output and outputs the count value thereof as an A/D conversion digital signal. In FIG. 9, the counter circuit to which the present invention is applied is surrounded by a broken line.

In the present embodiment, a counting operation period signal Tad and a reset signal illustrated in FIG. 2 are sent from a control circuit to the counter circuit to control A/D conversion of the counter circuit. Meanwhile, the comparator output corresponds to a count enable signal EN.

Counter clocks CK1 and CK2 are normally (in the case of an image sensor) produced by an external clock generator such as a frequency divider or a phase-locked loop (PLL). In such a case that the circuit scale is small, a frequency divider may be provided in the counter control circuit and produce the counter clock CK2 from the clock CK1 or produce the counter clock CK1 from the counter clock CK2.

FIG. 1A shows an example of a circuit of an existing asynchronous N-bit counter. Referring to FIG. 1A, the counter circuit shown generally includes a comparator, a clock pulse (hereinafter referred to merely as clock), a counter operation period signal, an AND circuit and a plurality of flip-flop circuits. In an asynchronous counter, a requisite number of flip-flops are connected in cascade connection, and all flip-flops are reset when the count value of the flip-flops becomes 2N. Usually, in the circuit diagram, the left end flip-flop in the cascade connection is represented as the lowest digit conversely to that in a digit representation of a numerical value.

For example, in FIG. 1A, the counter circuit shown is in the form of an existing asynchronous N-bit up counter circuit formed using D-type flip-flops. Within a period of time within which the both of the count enable signal EN and the counting operation period signal Tad have the high level, the counter clock CK is counted. The reset signal is used to reset the flip-flops which compose the counter so that the counter starts counting from the value 0.

FIG. 1B illustrates operation of the counter circuit shown in FIG. 1A. More particularly, FIG. 1B illustrates in what manner the output of each flip-flop varies. As can be seen from FIG. 1B, the flip-flop at each stage does not have a suspension period of pulse driving but is continuously driven in a fixed period. Further, it can be seen that the counting operation continues for a comparatively long period of time and reduction of the power consumption is achieved. For example, the counter circuit operates in the following manner.

(1) The reset signal is set to the L level to reset the D type flip-flops. The counter output B_0 ... B_(N-1) becomes the L level.

(2) The counting operation period signal Tad is set to the H level. The counting operation period signal Tad defines a maximum period of time within which the counter operates.

(3) The count enable signal EN is set to the H level, and consequently, the counter clock is inputted from the AND circuit shown in FIG. 1A to the counter so that the counter starts its counting operation. For example, where the counter circuit is used as a reference wave comparison type AD converter, a signal obtained by comparison of a reference wave and a signal wave by means of a comparator is used as the count enable signal EN.

(4) The counting operation period signal Tad changes the L level. Consequently, the output of the AND circuit thereafter exhibits the L level and the counting operation is stopped.

As seen from FIG. 1B, in the existing counter circuit described above, flip-flops of lower order bits such as the bit B_0 normally operate within the period of the counting operation. The flip-flops which operate at the low-order bits consume most part of the operation power of the counter circuit.

Figure 2A:
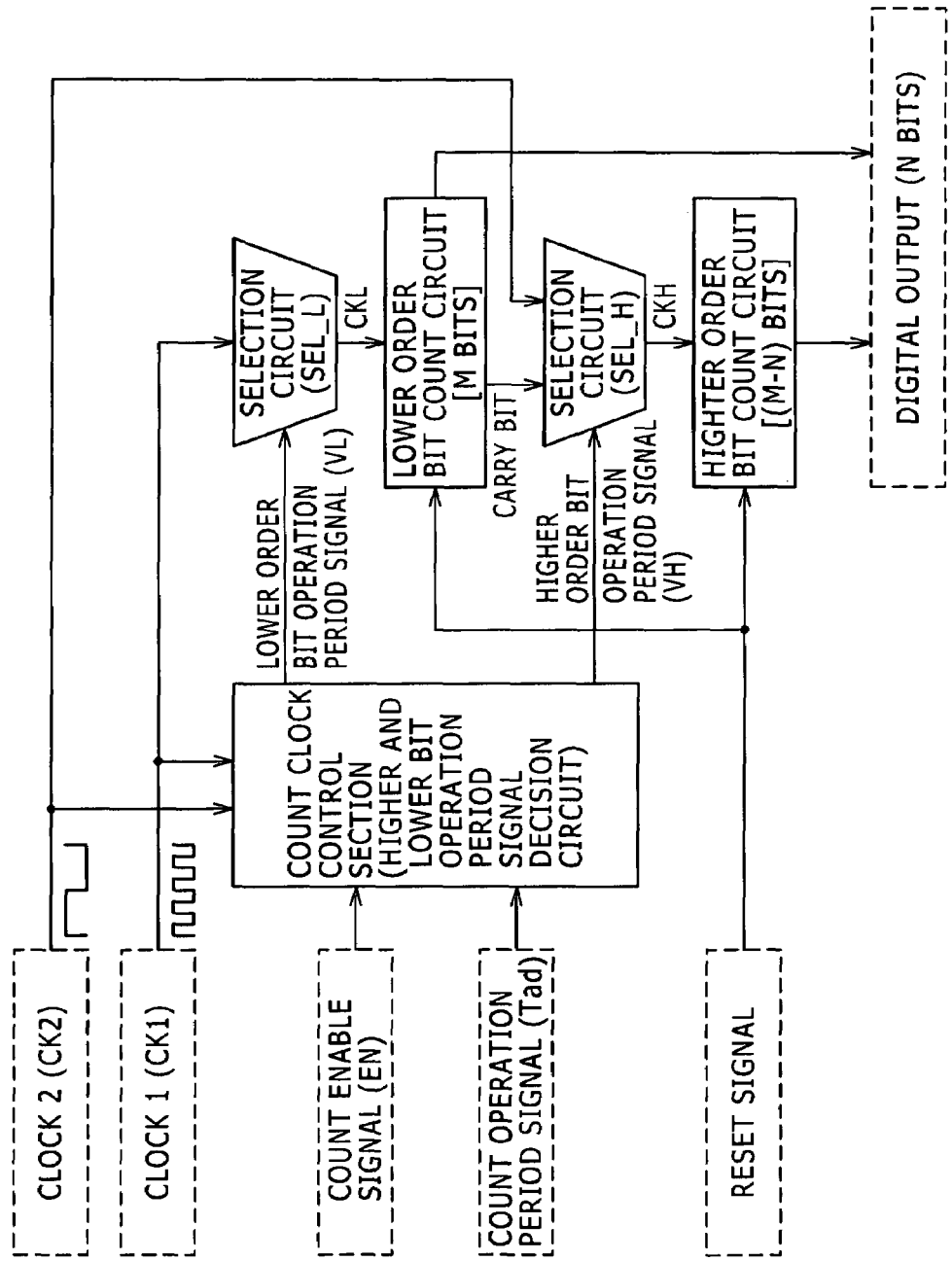
FIG. 2A is a block diagram showing a basic configuration of a counter circuit to which the present invention is applied.

FIG. 2A shows a basic configuration of a counter circuit to which the present invention is applied. Referring to FIG. 2A, the counter circuit of the present embodiment includes a control section, a lower order bit counter, a higher order bit counter, and selection circuits.

The control section controls operation of the lower order bit counter and operation of the higher order bit counter from signals inputted thereto. A high speed clock CK1 of a frequency f, a low speed clock CK2 of another frequency f/2^M, a counting operation period signal Tad and a count enable signal EN are inputted to the control section. The control section produces signals for controlling the lower order bit counter and the higher order bit counter, that is, a lower order bit counter operation period signal VL and a higher order bit counter operation period signal VH, from the input signals so that the lower and higher order bit counters may start their counting operation.

The lower order bit counter is a counter for lower order M bits. The high speed lock CK1 is inputted to the lower order bit counter through the corresponding selection circuit so that the lower bit counter carries out its counting operation while the lower order bit counter operation period signal VL is enabled. If the lower order bit counter generates a carry bit, then the carry bit is sent to the higher order bit counter.

Whether or not the carry out should be outputted depends upon the production signal for the VL signal. If the lower order bit counter should count a value equal to or higher than the count value 2^M depending upon the lower order bit counter operation period signal VL, then outputting of the carry bit is demanded. However, the lower order bit counter counts only a value lower than 2^M, then no carry bit need be outputted.

The carry bit is requisite also in two other cases. One of the two cases is a case wherein not zero but some other value other than 0 is set as an initial value for the flip-flops upon resetting of the counter. In this instance, since the counting operation does not start from 0, the lower order bit counter counts for one cycle, and therefore the carry bit is generated. The second case is a case wherein a counter is used to carry out addition of a CDS (Correlated Double Sampling) or a count value like an AD converter of an image sensor. Since, upon counting for the second time, a value other than 0 is provided in the lower order bit counter, the carry bit is generated without fail. Therefore, it is necessary for the carry to be connected to the higher order bit counter. Conversely speaking, since this carry bit exists, the counter circuit of the present embodiment can carry out same operation as that of the existing counter.

The higher order bit counter is a counter for higher order bits, that is, higher order N-M bits. When the higher order bit counter operation period signal VH is enabled, the selection circuit connected to the higher order bit counter connects the low speed clock CK2 to the counter so that the counter carries out counting of the low speed clock CK2. Within a period within which the higher order bit counter operation period signal VH is not enabled, the higher order bit counter is connected to the carry bit of the lower order bit counter such that, when the carry bit is generated, the higher order bit counter is operated.

The low speed clock CK2 has a relationship that it has a frequency of one 2^Mth that of the high speed clock CK1. This relationship is utilized such that the counting period which is defined by the counting operation period signal Tad and the count enable signal EN is counted by the higher order bit counter using the low speed clock CK2, but a period which is not divisible by the low speed clock CK2 is counted by the lower order bit counter using the high speed clock CK1. By this, the count value of the high speed clock CK1 can be outputted finally as a count value of N bits from the lower and higher order bit counters.

Figure 2B:
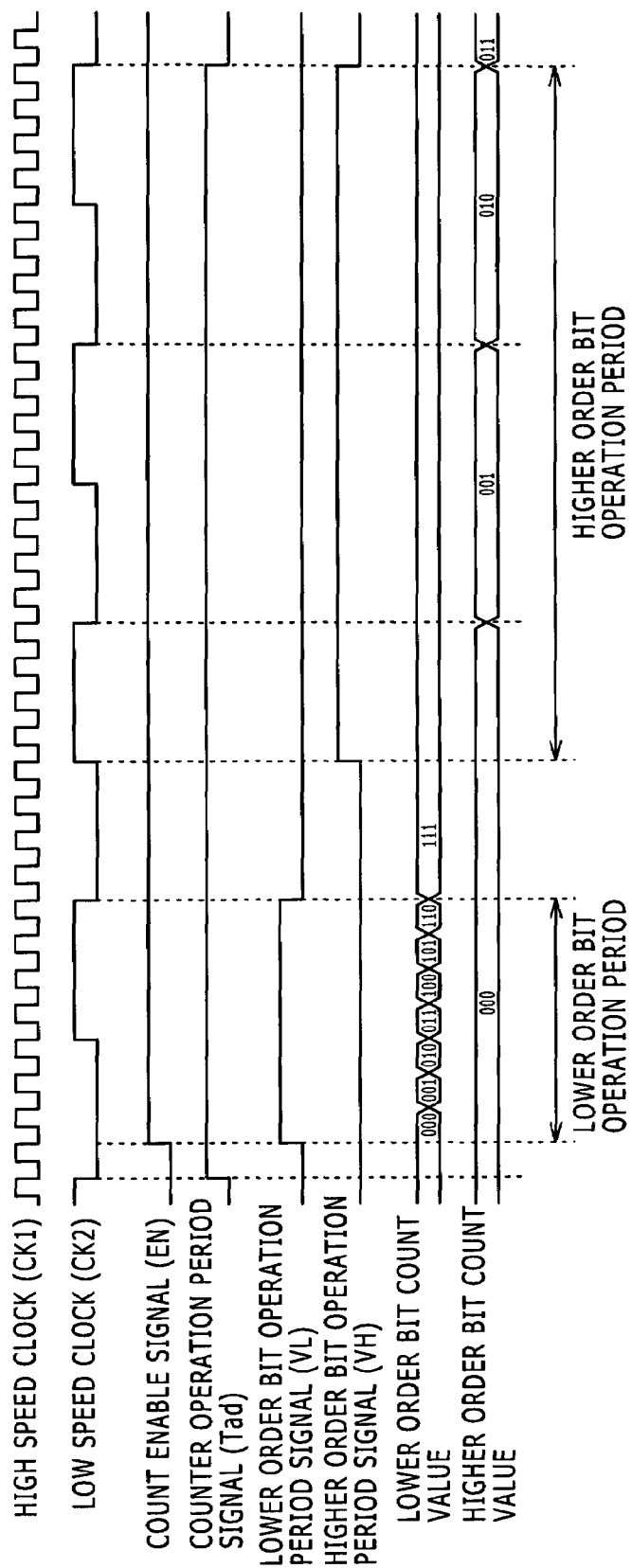
FIG. 2B is a timing chart illustrating operation of the counter circuit of FIG. 2A.

FIG. 2B illustrates operation of the counter circuit of FIG. 2A. Referring to FIG. 2B, in the operation illustrated, a low speed clock CK2 obtained by dividing the high speed clock CK1 by 2^3=8 is utilized, and counts of lower order 3 bits and higher order 3 bits are used. The counters carry out counting of the clocks within a period within which the count enable signal EN has the H level and besides the counting operation period signal Tad has the H level.

A higher and lower order bit operation decision circuit produces the lower order bit counter operation period signal VL, and while the lower order bit counter operation period signal VL has the H level, the high speed clock CK1 is inputted to and counted by the lower order bit counter past the corresponding selection circuit. In the present example, the value of the lower order bit counter is b'111.

The higher and lower order bit operation decision circuit produces the higher order bit counter operation period signal VH, and the signal to be inputted to the higher order bit counter is selected in accordance with the higher order bit counter operation period signal VH. In the present example, while the higher order bit counter operation period signal VH has the L level, the higher order bit counter is connected to the carry bit. If the higher order bit counter operation period signal VH is placed into the H level, then the low speed clock CK2 is inputted to and counted by the higher order bit counter. In the present example, a count value of b'011 is obtained.

Since the low speed clock CK2 has a frequency one eighth that of the high speed clock CK1, the final count value of the high speed clock CK1 is a value b'011111 which is the sum of b'011000 obtained by multiplying the count value of the higher order bit counter by 8 and the count value b'000111 of the lower order bit counter. The final value is equal to a juxtaposition of the value b'011 of the higher order bit counter and the value b'111 of the lower order bit counter. Thus, it can be recognized that an accurate count value is obtained by the technique of the present embodiment.

In the counter circuit of the present embodiment, as can be recognized also from FIG. 2B, the counter operation of the high speed clock CK1 is carried out at a minimum. Since the power consumption of a counter almost depends upon counting operation of lower order bits, according to the counter circuit of the present embodiment, significant reduction of the power consumption from that of the existing counter circuit ca be anticipated. Meanwhile, the accuracy of the counting operation can be assured with the accuracy of clock division.

Figure 2C:
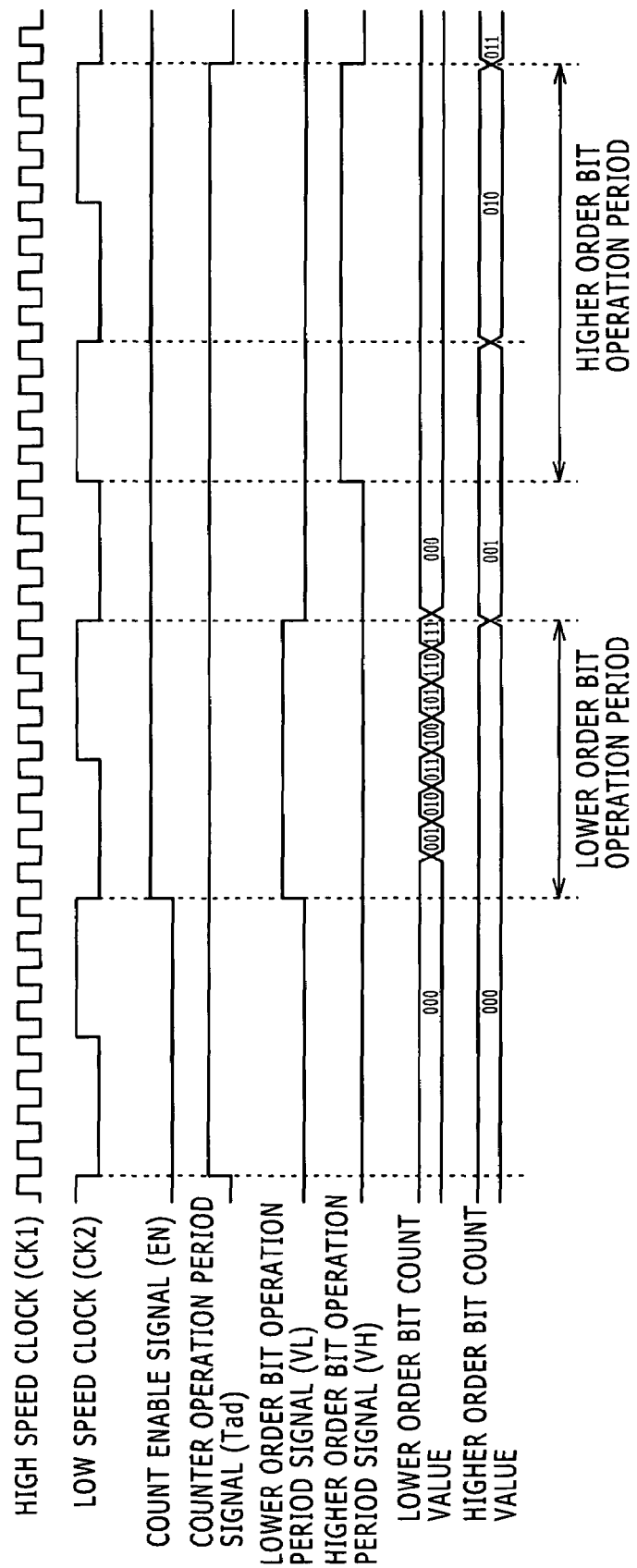
FIG. 2C is a timing chart illustrating operation of a carry bit in the circuit of FIG. 2A.

FIG. 2C illustrates operation of the counter circuit of FIG. 2A when the carry bit operates. Referring to FIG. 2C, the lower order bit counter operates in just one cycle and exhibits a value b'000. Furthermore, a carry bit (in the operation illustrated in FIG. 2C, the output of the lower order third bit) signal is connected to the higher order bit counter to operate the higher order bit counter. The reason why the period of the higher order bit counter operation period signal VH in the operation of FIG. 2C starts from a rising edge of the low speed clock CK2 is that it is intended to assure accurate reflection of the carry bit. It is to be noted that, since the higher order bit counter carries out its counting at a falling edge, even if the higher order bit counter operation period signal VH starts from a rising edge of the low speed clock CK2, no counting error occurs. As in the case of the example described above, the final value is b'011000.

WORKING EXAMPLE 1:

First Example

FIGS. 3A to 3D illustrates a first example of a working example 1. FIG. 3A illustrates a counter circuit which uses an asynchronous counter and wherein M=2, that is, ¼ division is used. An asynchronous up counter formed using D-type flip-flops is used and carries out counting within a period within which both of the counting operation period signal Tad defined by a counter operation period signal and the count enable signal EN exhibit the H level.

FIG. 3B shows an example of the higher and lower order bit operation period decision circuit in the working example 1. Referring to FIG. 3B, in the higher and lower order bit operation period decision circuit described above, a flip-flop 123 is used to synchronize the count enable signal EN with the high speed clock CK1. Another flip-flop 124 synchronizes the count enable signal EN with a rising edge of the low speed clock CK2 to finally produce a lower order bit counter operation period signal VL. A further flip-flop 125 synchronizes the count enable signal EN with a falling edge of the low speed clock CK2. The count enable signal EN from the flip-flop 125 and the counting operation period signal Tad are logically ANDed to produce the higher order bit counter operation period signal VH.

FIG. 3C illustrates counting operation of the first example of the working example 1 and particularly illustrates the counting operation wherein lower order bits are counted first and then higher order bits are counted. FIG. 3D illustrates different counting operation of the first example of the working example 1 and particularly illustrates the counting operation wherein lower order bits are counted first and then higher order bits are counted similarly. However, a carry bit is generated by the lower order bit counter and sent to the higher order bit counter.

An asynchronous up counter circuit of the working example 1 of the present embodiment is described. The circuit 10 shown in FIG. 3A is formed as an asynchronous N-bit counter, and FIG. 3B shows a particular configuration of the higher and lower order bit operation period decision circuit shown in FIG. 3A. Further, FIGS. 3C and 3D illustrate different counting operations of the circuit 10 of the working example 1.

In the circuit 10 shown in FIG. 3A, an asynchronous up counter formed using D-type flip-flops is used and counts the time after the count enable signal EN changes to the H level until the counting operation period signal Tad changes to the L level. The circuit 10 uses two clocks CK1 and CK2 having different frequencies from each other and a counting operation period signal Tad and includes a upper and lower bit operation period decision circuit 12, an AND circuit 13, a plurality of flip-flop circuits FF0, FF1, FF2, FF3, . . . , FFN, a switch 14 and so forth. For counting operation of lower order bits, the high speed clock CK1 is used, but for higher order bit counting operation, the low speed clock CK2 of a frequency divided to ½^M the high speed clock CK1 is used.

By disposing a switch next to the flip-flop stage corresponding to the lower order bit length, the flip-flops can be divided into flip-flop stages which define lower order bit counting operation and flip-flop stages which define higher order bit counting operation.

In the example of FIG. 3A, those flip-flop circuits which execute the lower order bit counting operation are the flip-flops FF0 and FF1. Those flip-flops which execute the higher order bit counting operation are the flip-flop circuits FF2, FF3, . . . , FFN. The count enable signal EN and the counting operation period signal Tad are inputted to and processed by the upper and lower bit operation period decision circuit 12. Thus, a lower order bit counter operation period signal VL corresponding to a lower order bit counting operation period is outputted from an output terminal 121 of the upper and lower bit operation period decision circuit 12, and a higher order bit counter operation period signal VH corresponding to a higher order bit counting operation period is outputted from an output terminal 122 of the upper and lower bit operation period decision circuit 12.

If the lower order bit counting operation is selected by the upper and lower bit operation period decision circuit 12, then the switch 14 is changed over to the SL side so that the high speed clock CK1 and an output of the output terminal 121 are inputted to the AND circuit 13. Consequently, a result of logical ANDing of the high speed clock CK1 and the output of the output terminal 121 is outputted from the AND circuit 13 and inputted to the first stage FF0 of the flip-flop circuits, whereupon counting operation is started. On the other hand, within a lower order bit counting operation period, the switch 14 is connected to the SL side and such a timing as defined by the lower order bit counter operation period signal VL is applied. Therefore, a timing necessary for higher order bit counting is not applied. Consequently, only the lower order bit counting operation is executed. Further, if the lower order bit count comes to 2^M, the carry signal is sent to the higher order bits as seen in FIG. 3D.

Then, if the higher order bit counting operation is selected by the upper and lower bit operation period decision circuit 12, then the switch 14 is changed over to the SH side, and the flip-flop circuits FF0 and FF1 disposed forwardly of the switch 14 do not carry out counting operation. Instead, the low speed clock CK2 is supplied to the FF circuit disposed following the switch 14, for example, to the flip-flop circuit FF2, by the upper and lower bit operation period decision circuit 12. Accordingly, counting operation is carried out at timings B2, . . . , FFN by the flip-flop circuits FF2, . . . , FFN disposed following the switch 14. This bit counting operation is carried out for a period of time of the higher order bit counter operation period signal VH. Consequently, the count value of the low speed clock CK2 is placed into the higher order bit counter of the flip-flop circuits FF2, . . . , FFN.

The low speed clock CK2 has a frequency equal to ½^M of the high speed clock CK1. Therefore, the count value of the low speed clock CK2 is equal to the value of ½^M of the high speed clock CK1, and a value obtained by shifting a binary code of the count value of the low speed clock CK2 by M bits becomes the count value of the high speed clock CK1.

Since, in the present working example, M=2, the binary value finally obtained from the circuit formed by connecting the flip-flop circuits FF0 and FF1 of the lower order bits and the flip-flop circuits FF2 to FFN of the higher order bits is the count value of the high speed clock CK1 within the period of time which begins at a rising edge of the count enable signal EN and ends at a falling edge of the counting operation period signal Tad.

In this manner, in the present working example, a corresponding circuit is driven only within a period of time within which counting of the high speed clock CK1 is requisite, but is not driven when no such driving is requisite. In the flip-flop circuits which are driven by a high speed pulse to be used for the lower order bit counting operation, since the power consumed upon switching is high, provision of a counting operation suspension period is a very effective countermeasure to achieve reduction of power consumption of the apparatus.

WORKING EXAMPLE 1:

Second Example

Figure 3E:
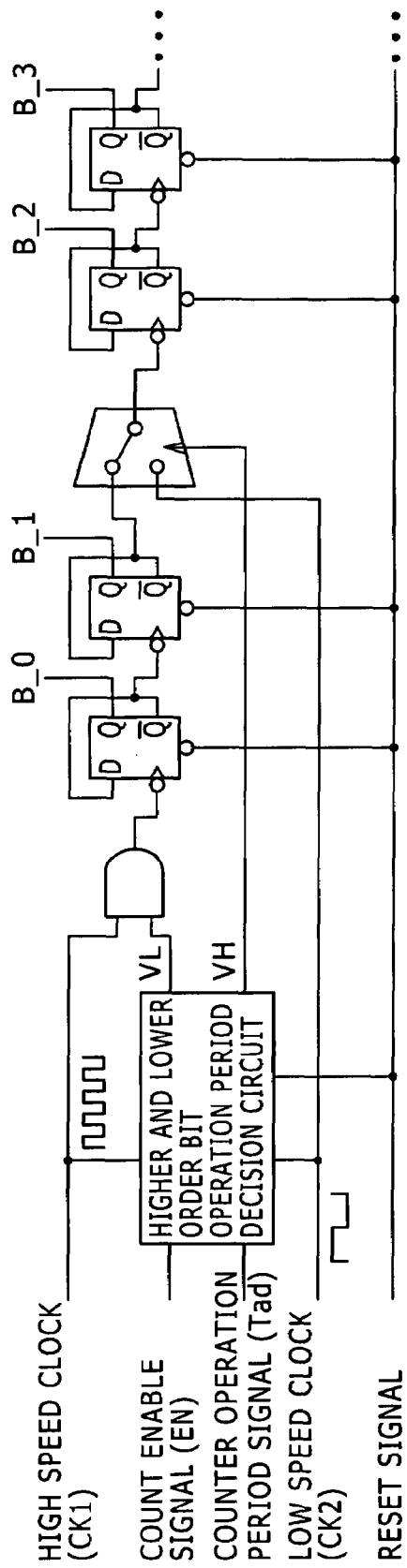
FIG. 3E is a block diagram of another counter circuit according to the first working example of the present invention which includes an asynchronous counter.
Figure 3H:
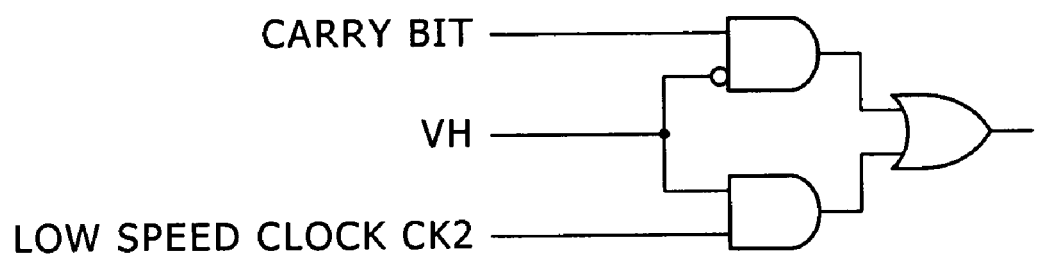
FIG. 3H is a circuit diagram showing an example of a circuit configuration of a selection circuit shown in FIG. 3A.

FIGS. 3E to 3H illustrate a second example of the working example 1. FIG. 3E shows a counter circuit formed using an asynchronous counter which is in turn formed using D-type flip-flops. FIG. 3F illustrates counting operation of the counter circuit of FIG. 3E. FIG. 3G shows an asynchronous counter which uses a mechanism disclosed in Japanese Patent Laid-Open No. 2005-311933. FIG. 3H shows an example of a circuit configuration of a switch 14.

FIG. 3E shows a counter circuit formed using an asynchronous counter formed from D-type flip-flops. The counter circuit down counts a period of time after the count enable signal EN changes over to the H level until the counting operation period signal Tad changes over to the L level similarly as in the counter circuit shown in FIG. 3A. A higher and lower order bit operation period decision circuit similar to that shown in FIG. 3B is used.

FIG. 3F illustrates operation of the circuit of FIG. 3E. Since the down counter is used, after the counting is started, the lower order bit count value becomes b'00→b'11. Also the higher order bit counter changes like b'00→b'11 through the carry bit to successively progress counting.

FIG. 3G shows an example of a configuration where the mechanism disclosed in Japanese Patent Laid-Open No. 2005-311933 is used in the present working example. According to this configuration, CDS operation can be carried out by changing over between the up counter shown in FIG. 3A and the down counter shown in FIG. 3F.

FIG. 3H shows an example of a circuit configuration of the switch 14 used in the working example 1 and so forth. The switch 14 shown exclusively changes over between inputs of the carry bit and the low speed clock CK2 in response to the higher order bit counter operation period signal VH.

WORKING EXAMPLE 2

Figure 4B:
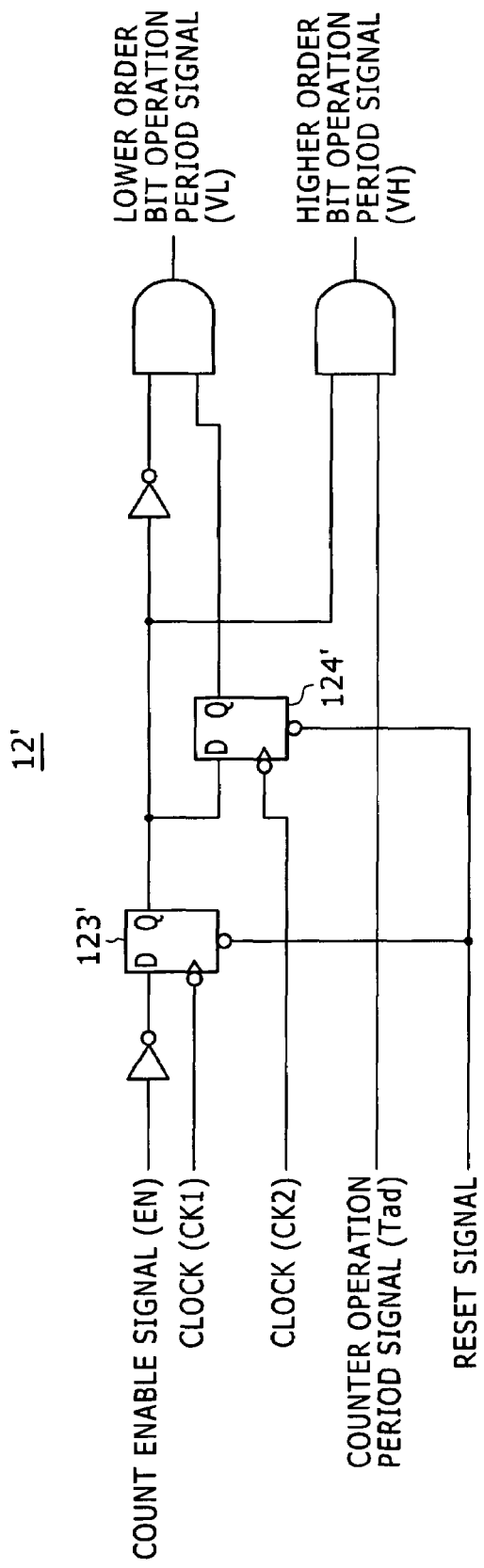
FIG. 4B is a block diagram showing an example of a higher and lower order bit operation period decision circuit used in the counter circuit of FIG. 4A.

FIGS. 4A to 4C show a working example 2. FIG. 4A shows a counter circuit formed using an asynchronous counter. In particular, an asynchronous down counter is used for lower order bits and an asynchronous up counter is used for higher order bits. FIG. 4B shows an example of a higher and lower order bit operation period decision circuit used in the counter circuit of the working example 2. FIG. 4C illustrates counting operation of the counter circuit of FIG. 4A wherein higher order bits are counted first and then lower order bits are counted.

The asynchronous counter circuit of the present working example 2 is described. The counter circuit 10' shown in FIG. 4A includes an asynchronous down counter used for lower order bits and an asynchronous up counter used for higher order bits. The circuit 12' of FIG. 4B is an example of a higher and lower order bit operation period decision circuit used in the counter circuit 10' of the working example 2 and includes inverters, flip-flop circuits and AND circuits. In the example shown in FIG. 4B, counting operation of higher order bits is carried out first, and then after the count enable signal EN changes to the H level, a signal for carrying out lower order bit counting operation is generated.

FIG. 4C illustrates counting operation of the counter circuit 10' of the working example 2. In the counter circuit of the present example, the count value within a period within which the counting operation period signal Tad has the H level and the count enable signal EN has the L level is determined. In the example described above, when b'10 is counted as the higher order bit count first, the count enable signal EN changes to the H level, and therefore, the higher order bit counting is completed (Count2). Thereafter, the lower order bit counter operates. The lower order bit counter first has b'11 set therein, and when it carries out down counting, a value of Count1 which is a complement to the value is obtained. Finally, the count value b'1000 is obtained. Although nine clocks are counted, since the counting is started from 0, b'1000=8 is obtained.

In the working example 2, no carry bit is used. This is because, since, in the present example, higher order bits are counted first, the lower order bits can assume only the values of b'00-b'11 and no carry bit is generated.

WORKING EXAMPLE 3

Figure 5A:
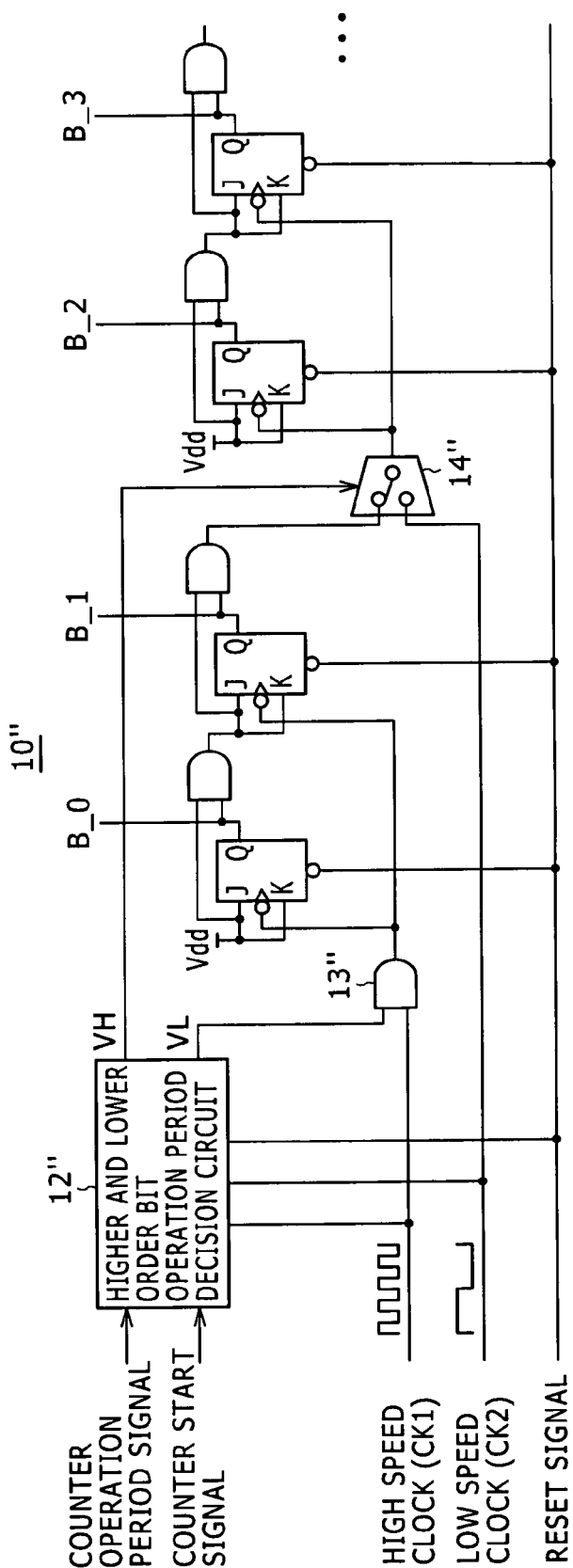
FIG. 5A is a block diagram of a counter circuit according to a third working example of the present invention which includes an asynchronous counter.

FIGS. 5A and 5B illustrate a working example 3. In particular, FIG. 5A shows a counter circuit 10" formed using a synchronous counter which is in turn formed using JK flip-flops. FIG. 5B illustrates operation counting operation of the counter circuit 10" shown in FIG. 5A.

The synchronous counter circuit 10" of the present working example 3 is described. Referring first to FIG. 5A, the counter circuit 10" shown is formed using a synchronous counter and starts counting in response to a count starting signal from within a period determined by a counting operation period signal. The high speed clock CK1 is supplied in parallel to a higher and lower order bit operation period decision circuit and flip-flop circuits of lower order bits B0 and B1 while the low speed clock CK2 is supplied in parallel to the higher and lower order bit operation period decision circuit and flip-flop circuits of higher order bits B2, . . . . The higher and lower order bit operation period decision circuit may be a circuit same as the circuit of FIG. 3B. The reset signal is supplied in parallel to the higher and lower order bit operation period decision circuit and the lower order bit flip-flop circuits and higher order bit flip-flop circuits. FIG. 5B illustrates counting operation of the counter circuit 10" of FIG. 5A.

As described above, according to the embodiment of the present invention, the following advantages can be anticipated.

1) Reduction of the Power Consumption of the Counter Circuit

In the existing counter circuit, the power is consumed most by counting operation of lower bits.

With the counting method proposed by the embodiment of the present invention, since the counting operation time of the lower order bits can be reduced, the total power consumption of the counter circuit can be reduced. Where the lower order bit counter uses N bits and the higher order bit counter uses M-N bits in an M-bit counter, with the existing counter, counting of the lowermost bit is carried out by $2^M$ times. However, in the present embodiment, the number of times of counting can be supplied to $2^M$ times. Accordingly, the count number of lower bits can be reduced to $2^{(N-M)}$ times that by the existing counter. Where the number of lower order bits is 6 in a 10-bit counter, the number of times of operation of the lower order bit counter is reduced to $\frac{1}{16}$.

2) The Capacitance Involved in High Speed Clock Lines Decreases.

In a synchronous counter circuit, since a clock is supplied parallelly to flip-flop circuits, the capacitance of clock lines increases, and increase of the power consumption upon clock operation may not be avoided. However, with the counter circuit of the present embodiment, since the high speed clock is supplied only to the lower order bits, no increase in capacitance is invited, and reduction of the power supply upon driving can be implemented.

3) The Circuit Configuration is Simple.

As can be recognized from the configuration examples described in connection of the embodiments of the present invention, the general circuit configuration is comparatively simple. In the case of a CMOS image sensor, it is easy to form the same integrally together with other function circuits on the same chip.

While the present invention is described in connection with the embodiment thereof, the technical range of the present invention is not restricted to the foregoing description of the embodiment. Various modifications and alterations can be made to the embodiment described above without departing from the spirit and scope of the invention, and also such modified and altered forms are included in the technical scope of the present invention.

Further, the embodiment of the present invention described above does not restrict the invention defined by the claims, and all of combinations of the characteristics described in connection with the embodiment are not necessarily be essential to the countermeasure provided by the present invention. The embodiment described includes various inventions at various stages, and various inventions can be extracted in suitable combinations of a plurality of features disclosed herein. Even if some features are deleted from all feathers of the embodiment, the configuration from which the features are deleted can be extracted as an invention as far as the advantages are achieved.

For example, while, in the embodiment described hereinabove, a circuit configuration and a timing chart of operation in a case wherein up counting is adopted as a basic counting mode are described, a similar mechanism can be applied also where down counting is adopted as a basic counting mode. If such a mechanism for the down counting mode as described above is adopted, then the counter circuit can be applied also to a case wherein a result of AD conversion of the reset level Srst of the pixel signal voltage Vx is obtained in the down counting mode or can be applied also to a case wherein a result of AD conversion of the reset level Srst or down signal level Ssig of the pixel signal voltage Vx is obtained in the down counting mode. Since the technique for modifying the counter circuit so as to be applied to a mechanism in the down counting mode can be created readily by those skilled in the art, description of a circuit configuration and a timing chart of operation of the counter circuit of the configuration described is omitted herein.

<Application to an Electronic Apparatus>

In the foregoing description, an AD conversion circuit or AD conversion apparatus, which is, in the example described hereinabove, a column AD circuit which includes a comparison section configured to compare an electric signal corresponding to a processing object signal and a reference signal for AD conversion and a counter section configured to carry out a counting process in a down count mode or an up count mode in parallel to the comparison process by the comparison section and retain a count value at a point of time when the counting process comes to an end is applied to a solid-state image pickup apparatus as a data processing apparatus. However, the mechanism of the AD conversion circuit or the data processing apparatus can be applied not only to a solid-state image display apparatus but also to any electronic apparatus which demands a mechanism for data processing, that is, AD conversion, of acquiring digital data of an analog signal level based on a physical property.

Further, the AD conversion circuit or AD conversion apparatus may be provided as a single apparatus in the form of, for example, an IC (Integrated Circuit) or an AD conversion module as well as may be provided in a form wherein it is incorporated in a solid-state image pickup apparatus or other electric apparatus.

In this instance, while the AD conversion circuit may be provided as an AD conversion apparatus which includes a comparison section and a counter section, it may otherwise be provided in a form wherein it is incorporated in a module which is a combination of ICs, individual chips and so forth and wherein a reference signal production section configured to produce and provide a reference signal for AD conversion to the comparison section and a control section for changing over the mode of a counting process of the counter section depending upon for which one of a reference component and a signal component the comparison section is carrying out a comparison process or a control section for controlling the bit operation periods TL and TH are disposed on the same semiconductor substrate.

By incorporating such various sections as described above, function sections necessary for controlling operation of the comparison section and the counter section can be handled collectively, and handling and management of the members are facilitated. Further, since elements necessary for an AD conversion process are collected or integrated as an IC or a module, also fabrication of finished products of a solid state image pickup apparatus and other electronic apparatus is facilitated.

What is claimed is:

1. A data processing method wherein an analog processing object signal is compared with a reference signal having a gradually varying value and used to convert the processing object signal into digital data and a counting process is carried out within a designated counting operation enabled period and then a count value at a point of time at which the counting process is completed is retailed to acquire digital data of N bits of the processing object signal, comprising the steps of:

carrying out, using a counter section including a lower order bit counter section for lower order M bits which operates with a first count clock and a higher order bit counter section for higher order N-M bits which operates with a second count clock obtained by dividing the first count clock by $2^M$, counting operations using the first and second count clocks, whose frequencies are different by an amount corresponding to a weight of the bits from each other, independently of each other; and compensating for an excess or deficiency of data of the higher order N-M bits counted using the second count clock with respect to the count value counted using the first count clock within the counting operation enabled period using the data of the lower order M bits counted using the first counter clock.

2. A data processing apparatus, comprising:

a comparison section configured to compare an analog processing object signal with a reference signal having a gradually varying value and used to convert the processing object signal into digital data; and a counter section including a lower order bit counter section for lower order M bits which operates with a first count clock and a higher order bit counter section for higher order N-M bits which operates with a second count clock obtained by dividing the first count clock by $2^M$, said counter section being configured to carry out counting operations within a counting operation enabled period based on a result of the comparison by said comparison section and retain a count value at a point of time at which the counting process is completed;

said counter section compensating for an excess or deficiency of data of the higher order N-M bits counted using the second count clock by said higher order bit counter section with respect to the count value counted using the first count clock within the counting operation enabled period using the data of the lower order M bits counted using the first counter clock by said lower order bit counter section.

3. The data processing apparatus according to claim 2, wherein said lower order bit counter section stops the counting operation when said higher order bit counter section carries out the counting operation.

4. A solid-state image pickup apparatus, comprising:

a reference signal production section configured to produce, from an analog processing object signal obtained from a pixel, a reference signal having a gradually varying value and used to convert the processing object signal into digital data;

a comparison section configured to compare the processing object signal with the reference signal produced by said reference signal production section; and a counter section including a lower order bit counter section for lower order M bits which operates with a first count clock and a higher order bit counter section for higher order N-M bits which operates with a second count clock obtained by dividing the first count clock by $2^M$, said counter section being configured to carry out counting operations within a counting operation enabled period based on a result of the comparison by said comparison section and retain a count value at a point of time at which the counting process is completed;

said counter section compensating for an excess or deficiency of data of the higher order N-M bits counted using the second count clock by said higher order bit counter section with respect to the count value counted using the first count clock within the counting operation enabled period using the data of the lower order M bits counted using the first counter clock by said lower order bit counter section.

5. An image pickup apparatus, comprising:

a reference signal production section configured to produce, from an analog processing object signal obtained from a pixel, a reference signal having a gradually varying value and used to convert the processing object signal into digital data;

a comparison section configured to compare the processing object signal with the reference signal produced by said reference signal production section;

a counter section including a lower order bit counter section for lower order M bits which operates with a first count clock and a higher order bit counter section for higher order N-M bits which operates with a second count clock obtained by dividing the first count clock by $2^M$, said counter section being configured to carry out counting operations within a counting operation enabled period based on a result of the comparison by said comparison section and retain a count value at a point of time at which the counting process is completed; and a control section configured to control production of control signals for controlling counting operation periods of said lower order bit counter section and said higher order bit counter section based on the counting operation enabled period so that, when the count value of said higher order bit counter section and the count value of said lower order bit counter section are connected into digital data of N bits with weighting of the bits taken into consideration, an excess or deficiency of data of the higher order N-M bits counted using the second count clock by said higher order bit counter section with respect to the count value counted using the first count clock within the counting operation enabled period is compensated for using the data of the lower order M bits counted using the first counter clock by said lower order bit counter section.

6. An electronic apparatus, comprising:

a reference signal production section configured to produce, from an analog processing object signal, a reference signal having a gradually varying value and used to convert the processing object signal into digital data;

a comparison section configured to compare the processing object signal with the reference signal produced by said reference signal production section;

a counter section including a lower order bit counter section for lower order M bits which operates with a first count clock and a higher order bit counter section for higher order N-M bits which operates with a second count clock obtained by dividing the first count clock by $2^M$, said counter section being configured to carry out counting operations within a counting operation enabled period based on a result of the comparison by said comparison section and retain a count value at a point of time at which the counting process is completed; and a counting period control section configured to control counting operation periods of said lower order bit counter section and said higher order bit counter section based on the counting operation enabled period so that, when the count value of said higher order bit counter section and the count value of said lower order bit counter section are connected with weighting of the bits taken into consideration, an excess or deficiency of data of the higher order N-M bits counted using the second count clock by said higher order bit counter section with respect to the count value counted using the first count clock within the counting operation enabled period is compensated for using the data of the lower order M bits counted using the first counter clock by said lower order bit counter section.

7. A data processing apparatus, comprising:

comparison means for comparing an analog processing object signal with a reference signal having a gradually varying value and used to convert the processing object signal into digital data; and counter means including lower order bit counter means for lower order M bits which operates with a first count clock and higher order bit counter means for higher order N-M bits which operates with a second count clock obtained by dividing the first count clock by $2^M$, said counter means being configured to carry out counting operations within a counting operation enabled period based on a result of the comparison by said comparison means and retain a count value at a point of time at which the counting process is completed;

said counter means compensating for an excess or deficiency of data of the higher order N-M bits counted using the second count clock by said higher order bit counter means with respect to the count value counted using the first count clock within the counting operation enabled period using the data of the lower order M bits counted using the first counter clock by said lower order bit counter means.

8. A solid-state image pickup apparatus, comprising:

reference signal production means for producing, from an analog processing object signal obtained from a pixel, a reference signal having a gradually varying value and used to convert the processing object signal into digital data;

comparison means for comparing the processing object signal with the reference signal produced by said reference signal production means; and counter means including lower order bit counter means for lower order M bits which operates with a first count clock and higher order bit counter means for higher order N-M bits which operates with a second count clock obtained by dividing the first count clock by $2^M$, said counter means being configured to carry out counting operations within a counting operation enabled period based on a result of the comparison by said comparison means and retain a count value at a point of time at which the counting process is completed;

said counter means compensating for an excess or deficiency of data of the higher order N-M bits counted using the second count clock by said higher order bit counter means with respect to the count value counted using the first count clock within the counting operation enabled period using the data of the lower order M bits counted using the first counter clock by said lower order bit counter means.

9. An image pickup apparatus, comprising:

reference signal production means for producing, from an analog processing object signal obtained from a pixel, a reference signal having a gradually varying value and used to convert the processing object signal into digital data;

comparison means for comparing the processing object signal with the reference signal produced by said reference signal production means;

counter means including lower order bit counter means for lower order M bits which operates with a first count clock and higher order bit counter means for higher order N-M bits which operates with a second count clock obtained by dividing the first count clock by 2^M, said counter means being configured to carry out counting operations within a counting operation enabled period based on a result of the comparison by said comparison means and retain a count value at a point of time at which the counting process is completed; and control means for controlling production of control signals for controlling counting operation periods of said lower order bit counter means and said higher order bit counter means based on the counting operation enabled period so that, when the count value of said higher order bit counter means and the count value of said lower order bit counter means are connected into digital data of N bits with weighting of the bits taken into consideration, an excess or deficiency of data of the higher order N-M bits counted using the second count clock by said higher order bit counter means with respect to the count value counted using the first count clock within the counting operation enabled period is compensated for using the data of the lower order M bits counted using the first counter clock by said lower order bit counter means.

10. An electronic apparatus, comprising:

reference signal production means for producing, from an analog processing object signal, a reference signal having a gradually varying value and used to convert the processing object signal into digital data;

comparison means for comparing the processing object signal with the reference signal produced by said reference signal production means;

counter means including lower order bit counter means for lower order M bits which operates with a first count clock and higher order bit counter means for higher order N-M bits which operates with a second count clock obtained by dividing the first count clock by 2^M, said counter means being configured to carry out counting operations within a counting operation enabled period based on a result of the comparison by said comparison means and retain a count value at a point of time at which the counting process is completed; and counting period control means for controlling counting operation periods of said lower order bit counter means and said higher order bit counter means based on the counting operation enabled period so that, when the count value of said higher order bit counter means and the count value of said lower order bit counter means are connected with weighting of the bits taken into consideration, an excess or deficiency of data of the higher order N-M bits counted using the second count clock by said higher order bit counter means with respect to the count value counted using the first count clock within the counting operation enabled period is compensated for using the data of the lower order M bits counted using the first counter clock by said lower order bit counter means.

* * * * *